(12) United States Patent
Nagata

(10) Patent No.: US 7,344,349 B2
(45) Date of Patent: Mar. 18, 2008

(54) POD COVER REMOVING-INSTALLING APPARATUS

(75) Inventor: Tatsuhiko Nagata, Saitama ken (JP)

(73) Assignee: Right Mfg. Co., Ltd., Tokyo (JP)

( * ) Notice: Subject to any disclaimer, the term of this patent is extended or adjusted under 35 U.S.C. 154(b) by 0 days.

(21) Appl. No.: 11/389,105

(22) Filed: Mar. 27, 2006

(65) Prior Publication Data

US 2006/0245851 A1 Nov. 2, 2006

Related U.S. Application Data

(62) Division of application No. 09/997,265, filed on Nov. 30, 2001, now Pat. No. 7,112,027.

(51) Int. Cl.
H01J 5/02 (2006.01)

(52) U.S. Cl. ........................ 414/411; 414/935

(58) Field of Classification Search ................ 414/217, 414/217.1, 411, 939; 251/167; 141/98
See application file for complete search history.

(56) References Cited

U.S. PATENT DOCUMENTS

| | | | |
|---|---|---|---|
| 1,668,990 A * | 5/1928 | Tromblay | ................ 242/573.2 |
| 3,079,102 A * | 2/1963 | Douglas | ..................... 242/573 |
| 4,783,108 A | 11/1988 | Fukuyama et al. | |
| 5,090,758 A | 2/1992 | Lord | |
| 5,291,923 A | 3/1994 | Gallagher et al. | |
| 5,772,386 A | 6/1998 | Mages et al. | |
| 5,775,837 A | 7/1998 | Schneider | |
| 6,013,920 A | 1/2000 | Gordon et al. | |
| 6,082,951 A | 7/2000 | Nering et al. | |
| 6,138,721 A | 10/2000 | Bonora et al. | |
| 6,261,044 B1 | 7/2001 | Fosnight et al. | |
| 6,273,261 B1 * | 8/2001 | Hosoi | ......................... 206/711 |
| 6,382,896 B1 | 5/2002 | Hu et al. | |
| 6,398,475 B1 | 6/2002 | Ishikawa | |
| 6,501,070 B1 * | 12/2002 | Bacchi et al. | ............... 250/239 |
| 6,530,736 B2 | 3/2003 | Rosenquist | |
| 6,533,521 B1 | 3/2003 | Todorov et al. | |
| 6,648,580 B2 * | 11/2003 | Lofgren | ...................... 414/607 |

FOREIGN PATENT DOCUMENTS

WO     WO 01/08212 A1     2/2001

OTHER PUBLICATIONS

Patent Abstracts of Japan, Yoshikawa Akira et al, Load Port Ion Semiconductor Wafer Processing System and Load Port carrying Truck, No. 11-354602,Dec. 24, 1999.
Patent Abstracts of Japan, Kimata Kazuo et al., Cover Latch Device for Pod Opener, No. 11-354602, Dec. 24, 1999.
Communication from the Korean Patent Office dated Nov. 8, 2007.

* cited by examiner

Primary Examiner—Charles A. Fox

(57) ABSTRACT

A pod cover removing-installing apparatus can open and close any covers for a variety of pods made by a various manufactures, can satisfy an allowable distortion error capable of being normally operated even if conditions such as temperature, humidity, and can remove and install the cover without causing it to collide with any one of the parts of the pods. The pod cover removing-installing apparatus to remove and install a cover for an opening of a pod, the inside of which is kept extremely clean, by causing the cover to engage a door for an opening of a high cleanliness room, while maintaining high cleanliness of the pod and the room by closely attaching the circumference of the two openings. The apparatus is provided with positioning pins for positioning the cover, a fine adjustment mechanism for fine adjustment of the positioning pins, and a holding mechanism for holding the position of the cover engaging the positioning pins.

7 Claims, 21 Drawing Sheets

FIG. 15(a) (E arrow line)
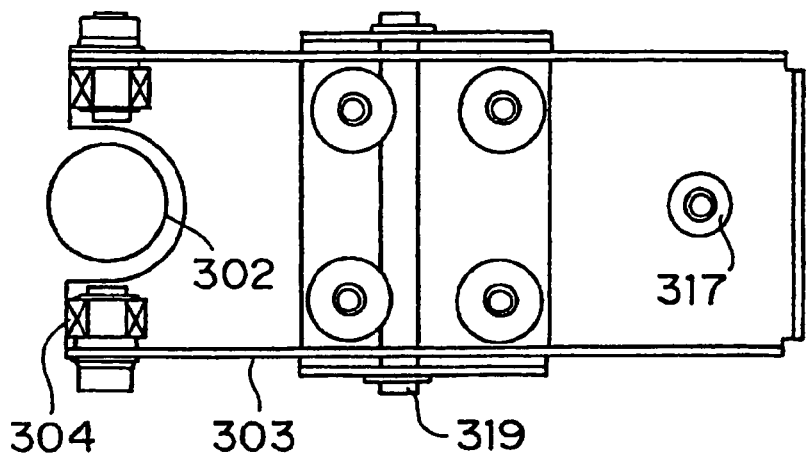
FIG. 15(b)
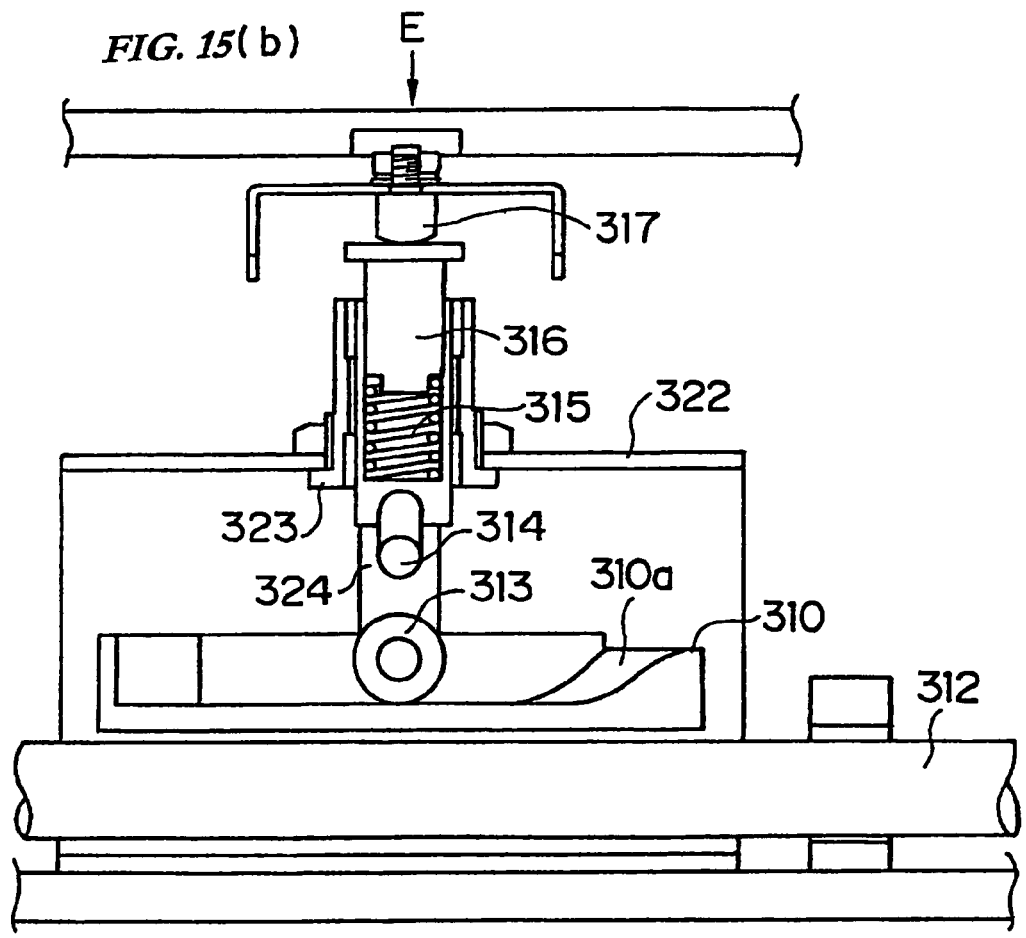

D-D section

POD COVER REMOVING-INSTALLING APPARATUS

CROSS REFERENCE TO RELATED APPLICATION

This application is a Divisional of application Ser. No. 09/997,265 filed Nov. 30, 2001, now issued as U.S. Pat. No. 7,112,027, and incorporated by reference herein.

BACKGROUND OF THE INVENTION

1. Field of the Invention

The present invention relates to a pod cover removing-installing apparatus for a pod which contains and transfers thin substrates such as semiconductor wafers from one space to another space while maintaining the cleanliness of both spaces.

2. Description of the Background Art

FIG. 21 shows an example of a conventional pod cover removing-installing apparatus.

This conventional pod cover removing-installing apparatus 100 is provided with a diaphragm 101 which partitions off a high clean space A and a low clean space B, an opening 102 formed in the diaphragm 101 that serves as a passage between the high clean space A and the low clean space B, a door 103 which opens and closes the opening 102 of the diaphragm 101, a latch mechanism 104 that latches the cover 203 of the pod 200 with two positioning pins 104a, 104b and two T-shaped keys 104c, 104d provided in the door 103, and a table 105 provided in the low clean space B for mounting the pod 200, which has three positioning pins 105a, 105b, 105c and one lock key 105d.

The pod 200 is a container with an extremely clean internal space C for containing a plurality of semiconductor wafers (25 wafers, for example).

This pod 200 is provided with a main container body 201, an opening 202 provided on one side of the main container body 201, a cover 203 for opening and closing the opening 202, the cover 203 having pin holes 204a, 204b for engaging the positioning pins 104a, 104b, and key holes 204c, 204d for engaging T-shaped keys 104c, 104d, and a bottom 205 having grooves 205a, 205b, 205c possessing a V-shaped section for engaging the positioning pins 105a, 105b, 105c, and a key hole 205d for engaging the lock key 105d.

When the pod 200 is placed on the table 105, the three positioning pins 105a, 105b, 105c engage the V-shaped section-possessing grooves 205a, 205b, 205c. In this instance, switching on a lock button, not shown in the drawing, causes the lock key 105d to move upward, become angled, and engage the key hole 205d. Then, the table 105 moves toward the diaphragm 101 for a prescribed distance (about 30 mm, for example), thereby causing the pod 200 to become attached to the diaphragm 101. A sealing material such as an O-ring, not shown in the figure, is provided along the circumference of the opening 102 of the diaphragm 101 and the opening 202 of the pod 200, to ensure close attachment of the openings and maintain cleanliness.

The movement of the table 105 causes the cover 203 of the pod 200 to become closely attached to the door 203, whereby the positioning pins 104a, 104b engage the pin holes 204a, 204b of the cover 203 and the T-shaped keys 104c, 104d engage the key holes 204c, 204d. Thereafter, the T-shaped keys 104c, 104d are rotated 90° by a rotary actuator or the like, not shown in the figure, whereby nails 204e to 204h are pulled in to release the lock between the container main body 201 and the cover 203.

Then, the door 103 is pulled into the space A (arrow D1) and caused to descend (arrow D2) by a drive mechanism, not shown in the figure, whereby the internal space C of the pod 200 and the internal space A of the partition board 101 are brought into communication while maintaining cleanliness.

In the conventional technology mentioned above, the pod 200 is made from a resin by molding. Because the formed article may be distorted depending on molding conditions or temperatures, the positioning pins 104a, 104b, the pin holes 204a, 204b of the cover 203, and the key holes 204c, 204d are tapered to ensure a smooth removing-installing operation.

However, when wafers with a large diameter (exceeding 300 mm) are placed in the pod 200, a very stringent standard is necessary to secure an allowable distortion error of ±0.5 mm. For this reason, significant difficulties may be encountered for performing the above operation in a stable manner. The following countermeasures are considered to overcome this problem.

(A) One method is to precisely fabricate and adjust each pair of the main container body 201 and cover 203, and assemble the apparatus using such a pair of the main container body 201 and cover 203. However, this method requires readjustment of the apparatus when another pod is used.

(B) Another method is to absorb a deviation between the main container body 201 and the cover 203 by designing the main container body 201 to be slightly movable. This method is effective for a small distortion, but ineffective for a large distortion. For example, even if there are no problems when the apparatus is new, distortions will be produced in two or three years after fabrication and the apparatus may not operate smoothly as time goes by.

An object of the present invention is to provide a pod cover removing-installing apparatus for a pod which can open and close any cover for a variety of pods made, according to the SEMI standard, by a variety of manufacturers. These pods can satisfy an allowable distortion error and are capable of being normally operated even if conditions such as temperature, humidity, and use for such a variety of pods change, and the covers of these pods can be removed and installed without causing it to collide with any one of the parts of the pods.

SUMMARY OF THE INVENTION

To achieve the above object, a first invention provides a pod cover removing-installing apparatus to remove and install a cover for an opening of a pod, the inside of which is kept extremely clean, by causing the cover to engage a door for an opening of a high cleanliness room, while maintaining high cleanliness of the pod and the room by closely attaching the circumference of the two openings, wherein the cover removing-installing apparatus comprises a positioning member to determine the position of the cover, a fine adjustment mechanism to finely adjust the position of the positioning member, and a holding mechanism to hold the position of the cover mated with the door by the positioning member.

A second invention provides the cover removing-installing apparatus described in the first invention, wherein the door is provided with a base plate and a position adjusting plate movable in the direction vertical to the plane, the positioning member is provided in the position adjusting plate. The fine adjustment mechanism is provided in the base plate and supports the position adjusting plate movable in the direction vertical to the plane, and the holding mechanism is provided in the base plate and holds the position of the position adjusting plate.

A third invention provides the cover removing-installing apparatus of the second invention, further having a centering mechanism for returning the position adjusting plate to the center.

A fourth invention provides the cover removing-installing apparatus of the second invention, further provided with a locking member which is provided in the position adjusting plate, rotates around the axis of the position adjusting plate, and engages the cover for locking or unlocking, a lock drive means which is provided on the base plate side to rotate the lock member, and an eccentric transmission mechanism which transmits the rotational power of the lock drive means to the lock member while allowing a deviation of the base plate and position adjusting plate in the direction vertical to the plane.

A fifth invention provides the cover removing-installing apparatus of the first to fourth inventions, wherein the holding mechanism cancels the holding of the position adjusting plate before the locking means locks the cover and holds the position adjusting plate after the lock member locks the cover.

A sixth invention provides the pod cover removing-installing apparatus according to any one of the first to fifth inventions, wherein the lock member cancels the lock in an initial stage of the inserting operation for inserting the cover into the opening of the pod.

A seventh invention provides a pod cover removing-installing apparatus to remove and install a cover for an opening of a pod, the inside of which is kept extremely clean, by causing the cover to engage a door for an opening of a high cleanliness room, while maintaining high cleanliness of the pod and the room by closely attaching the circumference of the two openings, wherein the cover removing-installing apparatus comprises a lock member to lock the cover by engaging the same and a cover securing means to secure the cover to the door by retracting the lock member to the door side.

An eighth invention provides a pod cover removing-installing apparatus to remove and install a cover for an opening of a pod, of which the inside is kept extremely clean, by causing the cover to engage a door for an opening of a high cleanliness room, while maintaining high cleanliness of the pod and the room by closely attaching the circumference of the two openings, wherein the cover removing-installing apparatus comprises a positioning member to determine the position of the cover by engaging the engaged part of the cover and a position securing means to position and secure the positioning member to the engaged part of the cover by changing the external diameter of the positioning member.

A ninth invention provides the pod cover removing-installing apparatus according to the eight invention, wherein the position securing means is provided in the circumference of the positioning member and has a stretch member capable of stretching according to an increase or decrease in the internal pressure.

A tenth invention provided the pod cover removing-installing apparatus according to the eight invention, wherein the position securing means is formed in the positioning member and has a broken part to change the diameter thereof by a mechanical force.

An eleventh invention provides the pod cover removing-installing apparatus according to any one of the first to tenth inventions, wherein the positioning member has an outer casing with a tapered end, an inner casing installed freely movably in the axial direction of the outer casing, having a taper with the same angle as the taper of the outer casing at its end, and arranged so that the two tapers become continuous when protruding, and a pushing means to push the inner casing in the protruding direction.

A twelfth invention provides the pod cover removing-installing apparatus according to any one of the first to eleventh inventions, further comprising a linking posture corrective means which corrects the linking posture of the pod, a pod table having the pod installed thereon to carry the positioning member to the linking position, a securing means to secure the pod on the pod table, containing a V-section groove provided on the bottom of the pod and a linking pin provided on the pod table for engaging the V-section groove, wherein the linking posture corrective means is provided in the range in which the linking pin and the V-section groove can come into contact with each other and constitutes a fixed plane almost vertical to the moving direction of the pod table.

A thirteenth invention provides the pod cover removing-installing apparatus according to any one of the first to eleventh inventions, further comprising a linking posture corrective means which corrects the linking posture of the pod, wherein the linking posture corrective means comprises a pressing member provided on the periphery of the door to press the top and/or the side of the cover of the pod and capable of freely moving in the moving direction of the table or in the vertical direction thereto within a prescribed movable range.

BRIEF DESCRIPTION OF THE DRAWINGS

FIGS. 14(a) and (b) are drawings showing the main part of the second embodiment of the pod cover removing-installing apparatus of the present invention, wherein FIG. 14(a) is a cross sectional view along the line A-A of FIG. 13

FIGS. 15(a) and (b) are drawings showing the main part of the second embodiment of the pod cover removing-installing apparatus of the present invention, wherein FIG. 15(a) is a drawing viewed from the arrow E in FIG. 15(b) and FIG. 15(a) is a cross sectional view along the line C-C of FIG. 13.

DETAILED DESCRIPTION OF THE PREFERRED EMBODIMENTS

The present invention will be described in more detail by way of preferred embodiments with reference to the attached drawings.

First Embodiment

Figure 1:
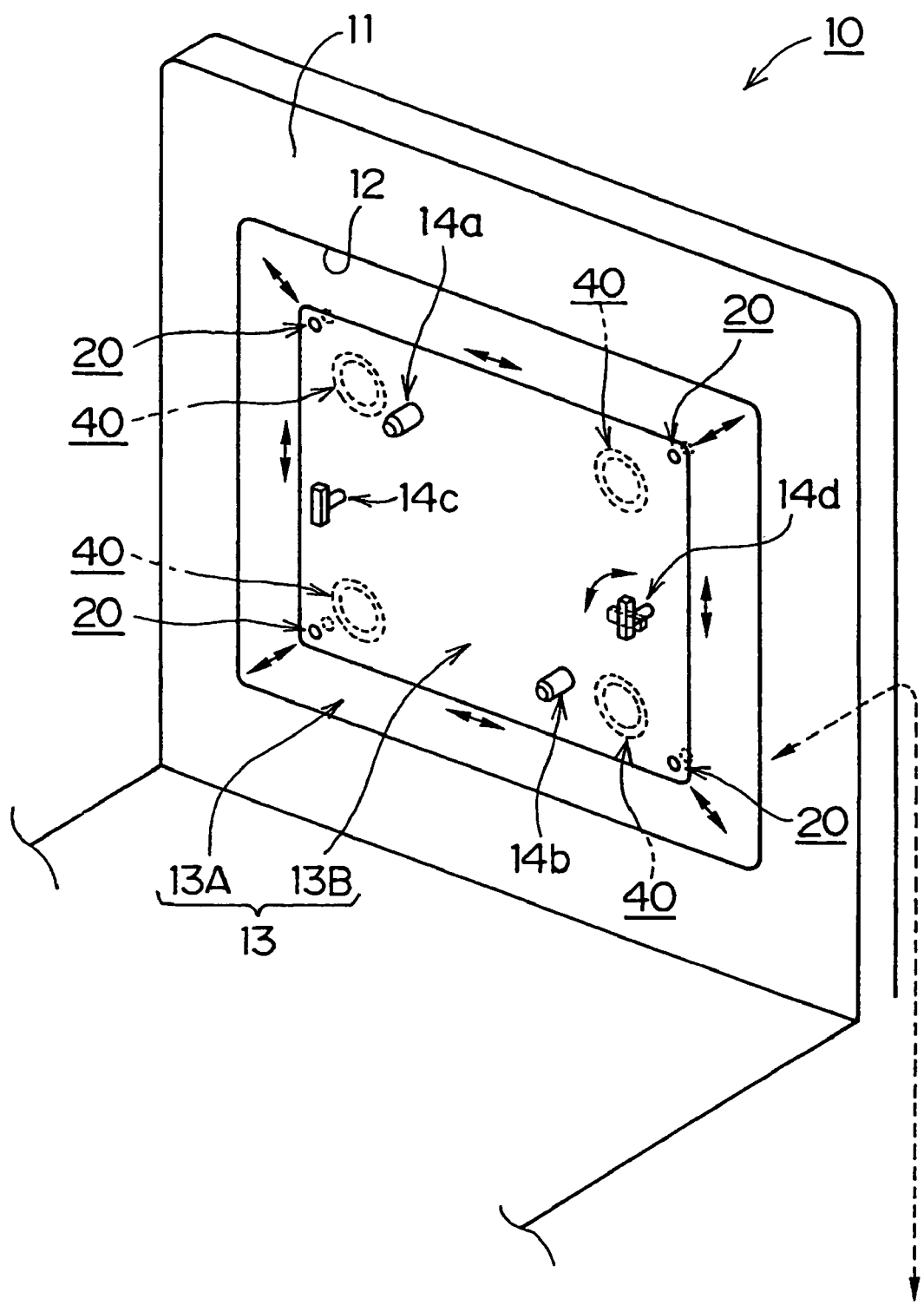
FIG. 1 is a perspective view showing an outline of a first embodiment of the cover removing-installing apparatus for a pod of the present invention.
Figure 2:
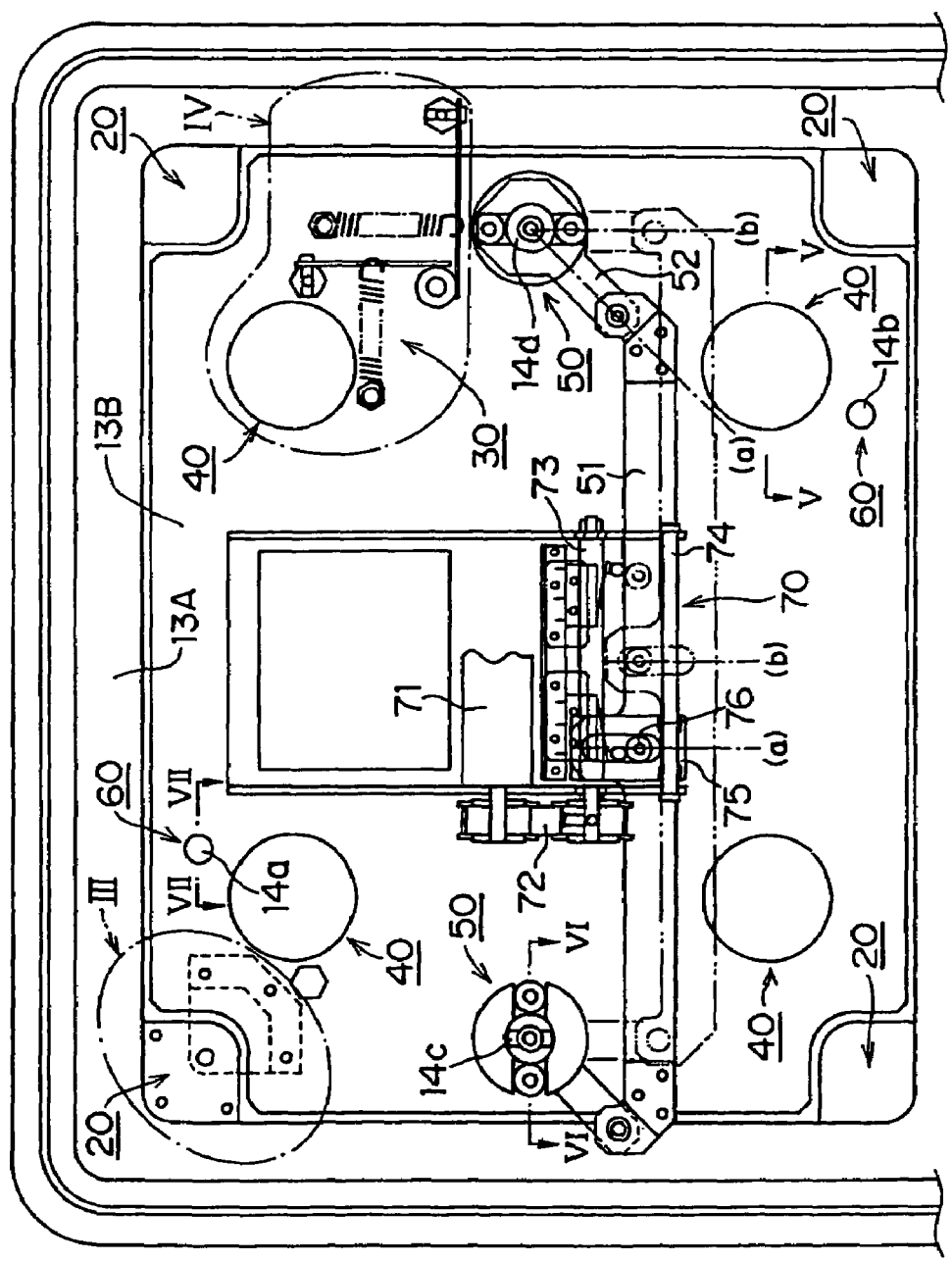
FIG. 2 is a front view of the first embodiment of the cover removing-installing apparatus for a pod of the present invention.

FIGS. 1 and 2 are drawings showing a first embodiment of the pod cover removing-installing apparatus of the present invention, wherein FIG. 1 is a perspective view showing an outline and FIG. 2 is a plan view of the apparatus.

This pod cover removing-installing apparatus is provided with a diaphragm 11, an opening 12, a door 13 which opens and closes the opening 12 of the diaphragm 11, two positioning pins 14a, 14b and two T-shaped keys 14c, 14d, a latch mechanism 14 which opens and closes a cover 203 of a pod 200, and the like.

In the first embodiment, the door 13 is provided with a base plate 13A and a position adjusting plate 13B movable in the direction vertical to the plane so that its position can be adjusted with respect to the base plate 13.

The door 13 is provided therein with four fine adjustment mechanisms 20, two centering mechanisms 30, four holding mechanisms 40, two eccentric transmission mechanisms 50, one positioning fixing means 60, and the like.

Figure 3A:
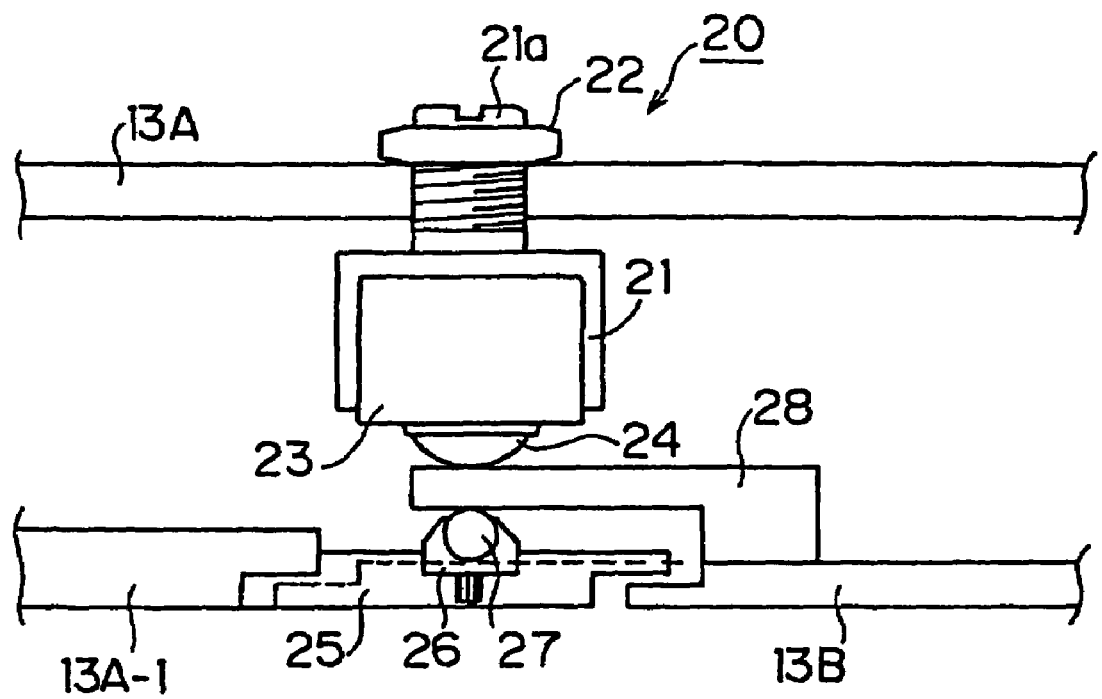
FIGS. 3(a) and 3(b) are enlarged views of the part III of FIG. 2 and show the fine adjustment mechanism for the pod cover removing-installing apparatus of the first embodiment.
Figure 3B:
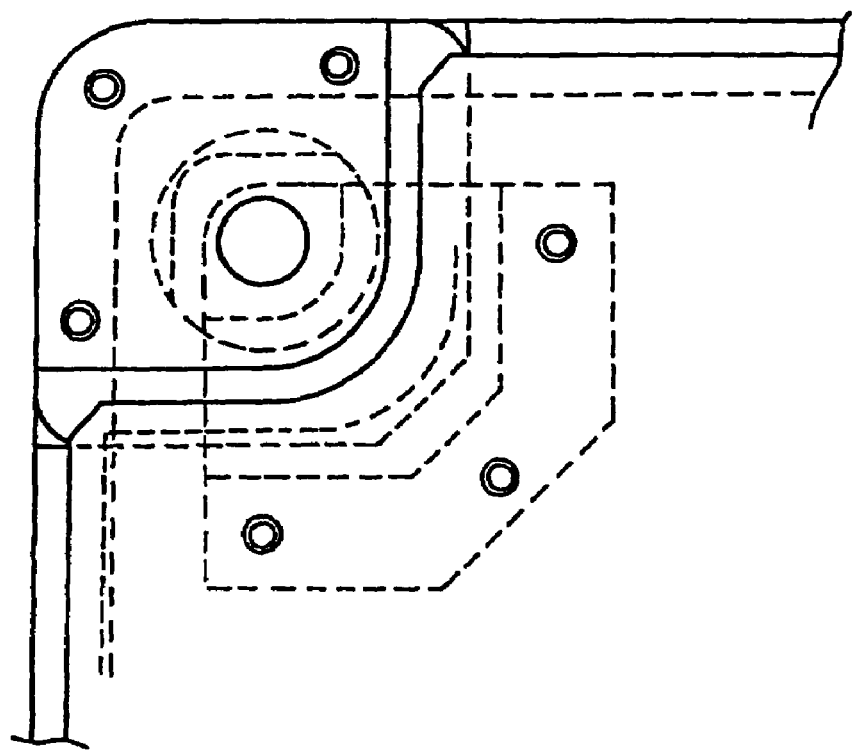

FIGS. 3(a) and 3(b) are enlarged views of the part IIII of FIG. 2 and show the fine adjustment mechanism for the pod cover removing-installing apparatus of the first embodiment.

The fine adjustment mechanism 20 supports the position adjusting plate 13B movable in the direction vertical to the plane and exactly adjusts the position of the positioning pins 14a and 14b. This fine adjustment mechanism 20 is provided in the four corners of the position adjusting plate 13B (see FIG. 1), each having a fixture 21 for fastening and securing the base plate 13A using a thread 21a, a female screw 22 for keeping the fixture 21 from loosening, a receiving member 23 of free bearings and the like inserted into the fixture 21, a ball 24 rotatively supported by the receiving member 23, an opposing plate 25 provided in the base plate frame 13A-1 on the opposing side, a receiving member 26 provided in the opposing plate 25, a ball 27 rotatively supported in the receiving member 26, a guide plate 28 provided on the side of position adjusting plate 13B and movably squeezed by the ball 24 and the ball 27.

The fine adjustment mechanism 20 is designed so that in the initial state in which the positioning pins 14a, 14b engage the pin holes 204a, 204b of the pod 200 (see FIG. 21), tapered tips of the positioning pins 14a, 14b move a prescribed distance (e.g. 3 mm in every direction) vertically to the plane, while the tapered tips match the tapered pin holes 204a, 204b. For this reason, even if there is some error in the position of the pin holes 204a, 204b of the pod 200, the positioning pins 14a, 14b can easily engage these pin holes without colliding.

Figure 4A:
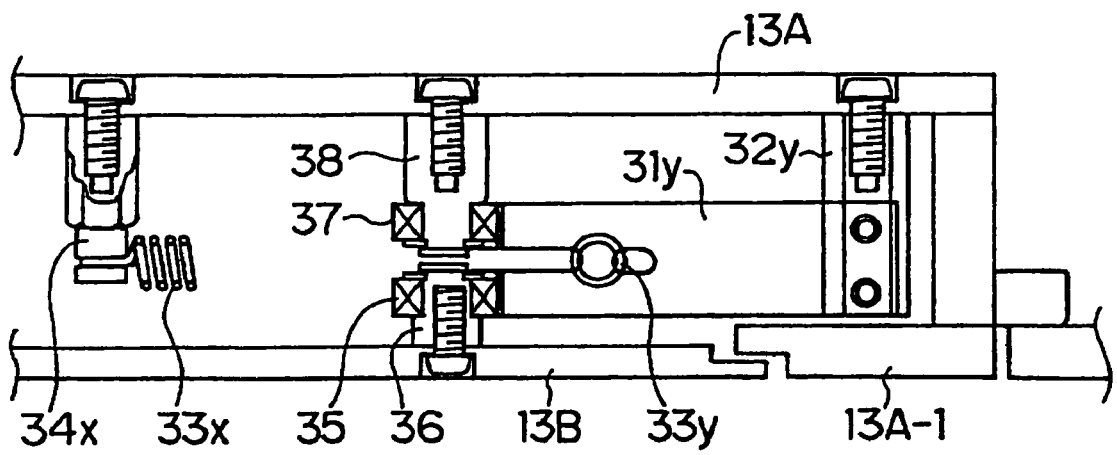
FIGS. 4(a) and 4(b) are enlarged views of the part IV of FIG. 2 and show the centering mechanism for the pod cover removing-installing apparatus of the first embodiment.
Figure 4B:
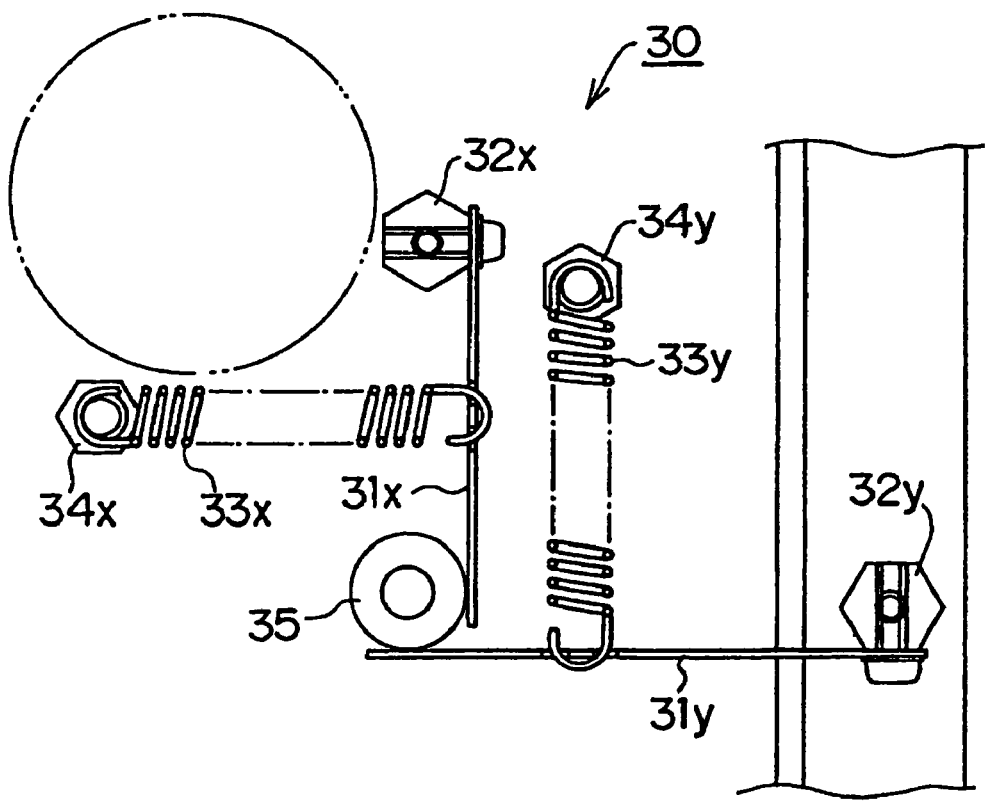

FIGS. 4(a) and 4(b) are enlarged views of the part IV of FIG. 2 and show the centering mechanism for the pod cover removing-installing apparatus of the first embodiment.

The centering mechanism 30 is a mechanism for causing the position adjusting plate 13B to return to the center. The centering mechanism 30, consisting of two systems, one in the horizontal direction (x direction) and the other in the vertical direction (y direction), is provided with press boards 31x, 31y, securing members 32x, 32y for securing the press boards 31x, 31y in the base plate 13A, coil springs 33x, 33y for moving the press boards 31x, 31y to the center, securing members 34x, 34y for securing the other ends of the coil springs 33x, 33y to the base plate 13A, guide pieces 35, 37 which come into contact with the press boards 31x, 31y, securing members 36, 38 for securing the guide pieces 35, 37 in the position adjusting plate 13B and base plate 13A, and the like.

The press board 31x aligns the guide pieces 35, 37 on a straight line in the X direction. In the same manner, the press board 31y aligns the guide pieces 35, 37 on a straight line in the Y direction. The position adjusting plate 13B is centered by these actions.

Although omitted from FIG. 2, a mechanism which is the same but symmetrical with the mechanism shown in the upper right side is provided in the upper left side of the FIG. 2.

Figure 21:
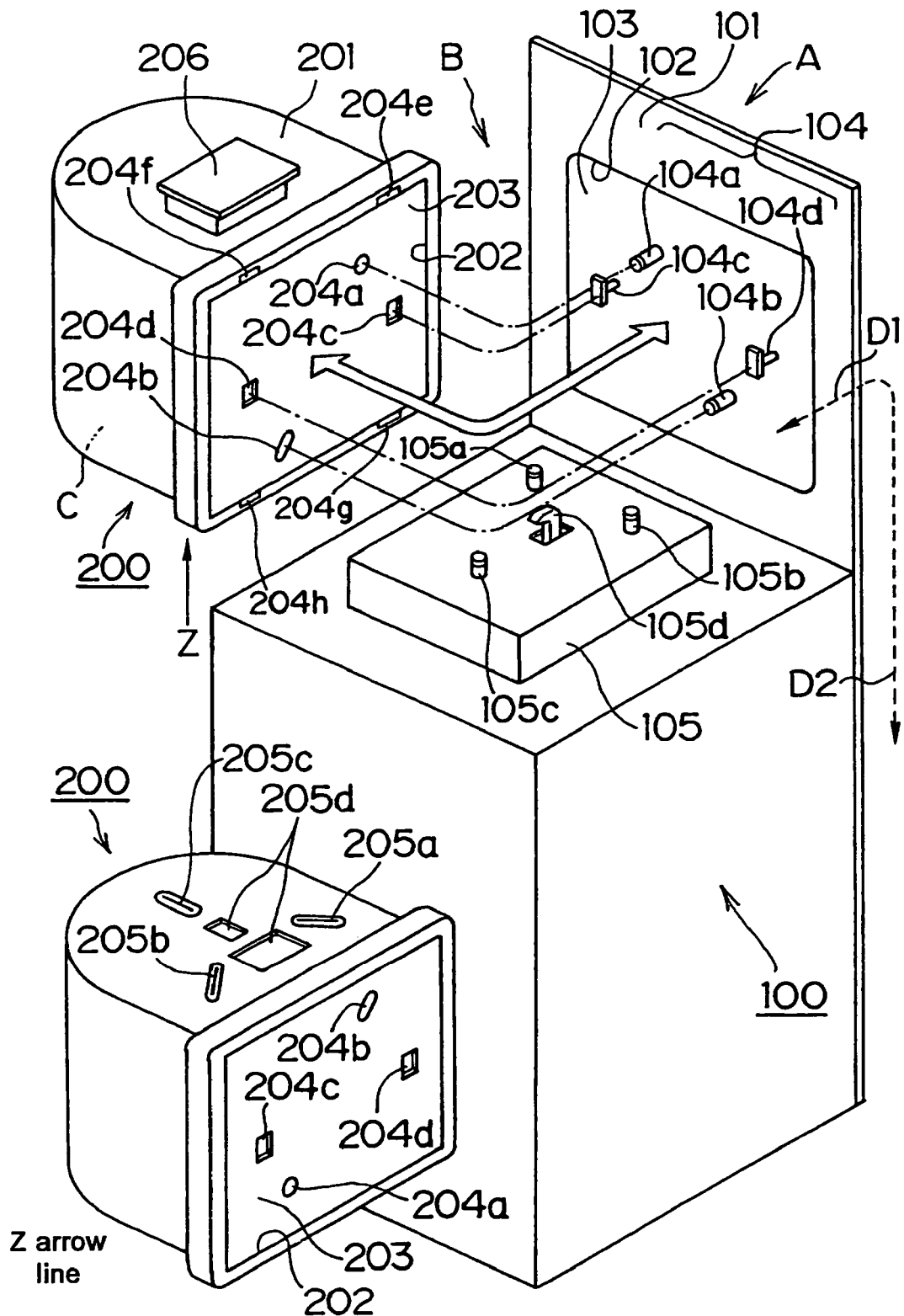
FIG. 21 shows an example of a conventional pod cover removing-installing apparatus.

Because the position adjusting plate 13B can move vertical to the plane with respect to the base plate 13A by means of the fine adjustment mechanism 20, the centering mechanism 30 always causes the position adjusting plate 13B to be positioned in the previously determined center position (the engaging position without an error) in the initial state in which the positioning pins 14a, 14b engage the pin holes 204a, 204b of the pod 200 (see FIG. 21).

Figure 5:
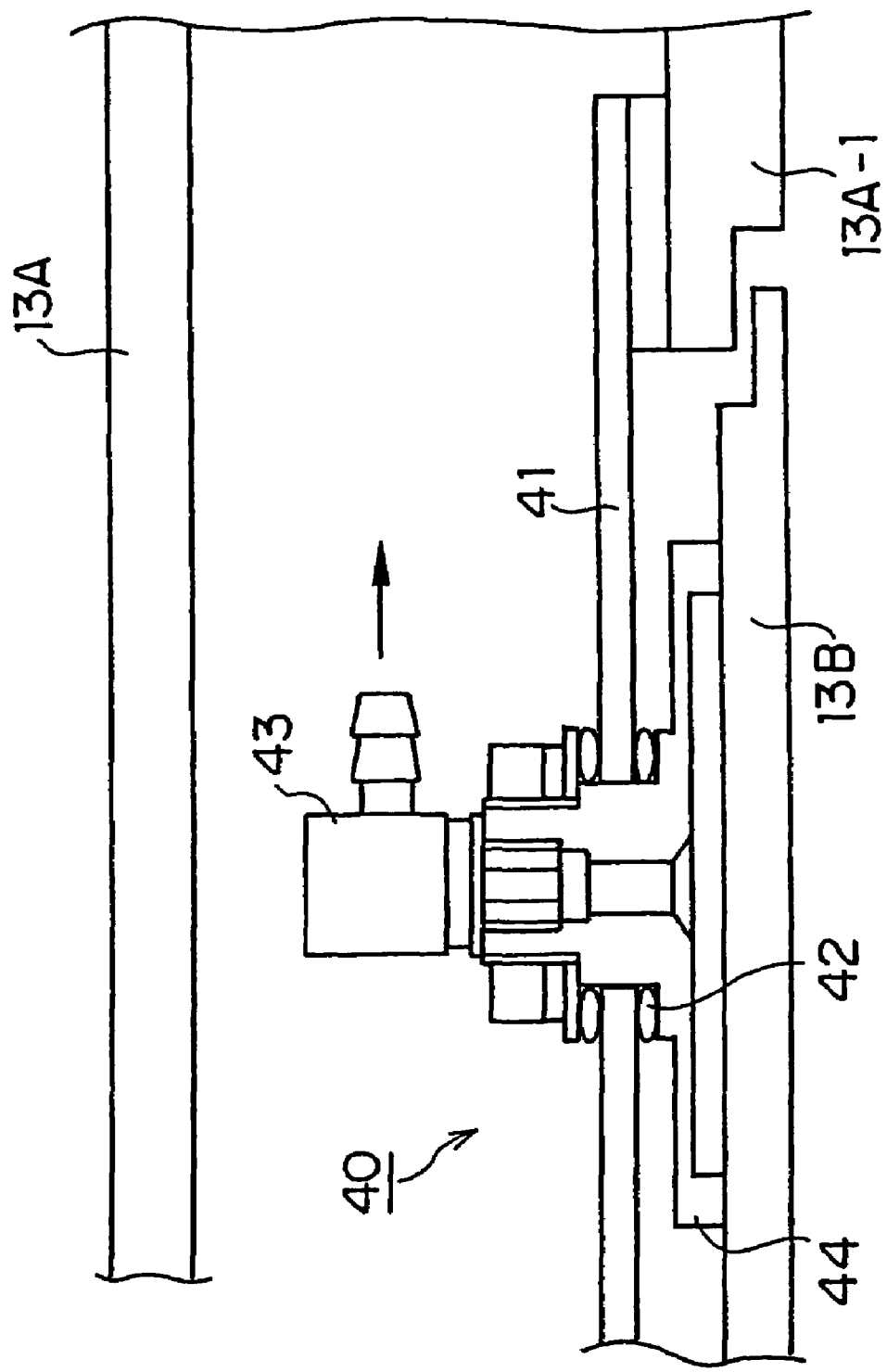
FIG. 5 is a cross sectional view along the line V-V of FIG. 2 and shows the holding mechanism of the pod cover removing-installing apparatus of the first embodiment.

FIG. 5 is a cross sectional view along the line V-V of FIG. 2 and shows the holding mechanism of the pod cover removing-installing apparatus of the first embodiment.

The holding mechanism 40 holds the position adjusting plate 13B to the cover 203 of the pod 200 at the position where the positioning pins 14a, 14b engage. The holding mechanism 40 has a securing plate 41 provided in a base plate frame 13A-1, a joint 43 connected with this securing plate 41 through the O-ring 42, having a nozzle (not shown in the figure) connected to a vacuum pressure source, and an absorption pad 44 provided in the joint 43 which is capable of being attached to the position adjusting plate 13B.

Because the position adjusting plate 13B can move vertical to the plane with respect to the base plate 13A by means of the fine adjustment mechanism 20, the holding mechanism 40 can hold the positioning pins 14a, 14b to engage the pin holes 204a, 204b of the pod 200 (see FIG. 21). This structure ensures that the container maintains the same position as the position before removal when the cover 203 has been once removed and returned thereafter. Therefore, the cover can be closed without impediment.

Figure 6A:
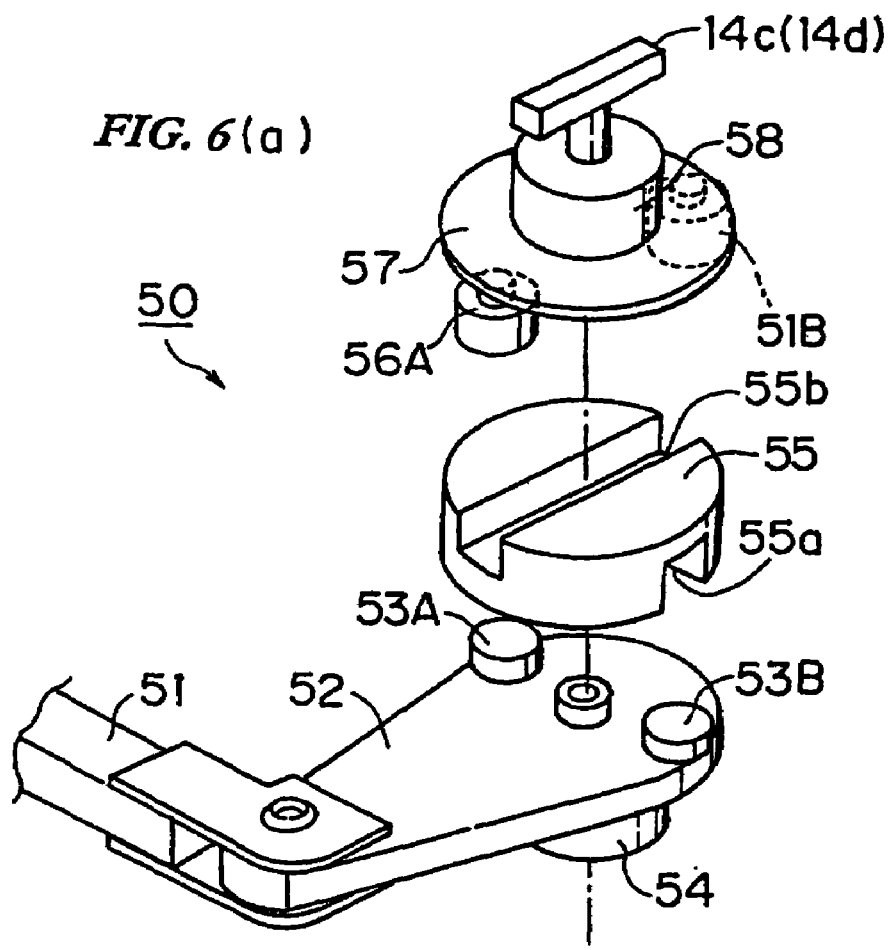
FIG. 6(a) is a perspective view and FIG. 6(b) is a cross sectional view along the line VI-VI of FIG. 2, showing an eccentric transmission mechanism for the pod cover removing-installing apparatus of the first embodiment.
Figure 6B:
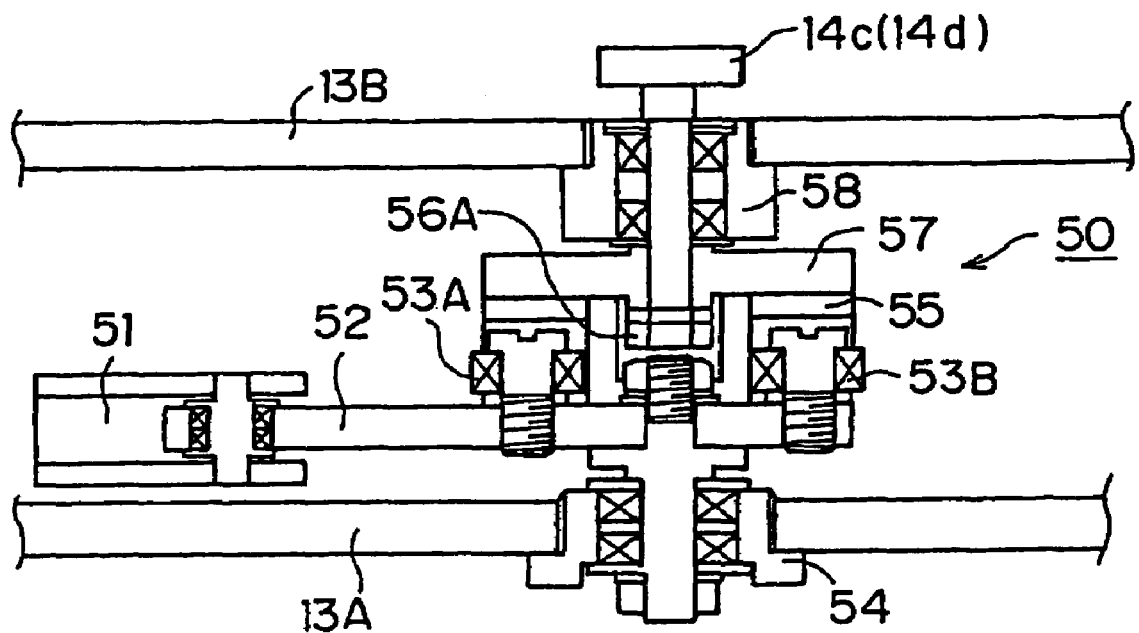

FIG. 6(a) is a perspective view and FIG. 6(b) is a cross sectional view along the line VI-VI of FIG. 2, showing an eccentric transmission mechanism for the pod cover removing-installing apparatus of the first embodiment.

The T-shaped key 14c (14d) is provided in a prescribed position of the position adjusting plate 13B to engage the key hole 204c (204d) of the cover 203 to lock the cover 203, and driven by a lock drive mechanism 70 (see FIG. 2). This lock drive mechanism 70 is provided on the side of the base plate 13A and rotates in either direction around the axis of the T-shaped key 14c (14d) to perform locking or unlocking movements.

Because it is desirable to make the position adjusting plate 13B light for ease of movement, the lock drive mechanism 70 and the like are preferably installed on the base plate 13A. For this reason, an eccentric transmission mechanism 50 is provided to transmit a driving force from the lock drive mechanism 70 to the T-shaped key 14c (14d).

This eccentric transmission mechanism 50 allows a deflection of the base plate 13A and position adjusting plate 13B in the direction vertical to the plane and transmits a rotational force of the lock drive mechanism 70 to the T-shaped key (locking member) 14c (14d).

As shown in FIGS. 6(a) and 6(b), the eccentric transmission mechanism 50 has a driving lever 51 connected to the lock drive mechanism 70, a rotation lever 52 rotatively connected to the driving lever 51, a bearing 54 supporting the rotation lever 52 on the base plate 13A in a freely rotative manner, transmission rollers 53A, 53B provided on the rotation lever 52, a slide disc 55 having grooves 55a, 55b orthogonally provided on both sides, into which the transmission rollers 53A, 53B and transmission rollers 56A, 56B are respectively inserted, a rotation board 57 provided on the same axis with the T-shaped key 14c (14d), a bearing 58 having the transmission rollers 56A, 56B provided therein and supporting the axis of the rotation board 57 and the T-shaped key 14c (14d) on the position adjusting plate 13B in a freely rotative manner, and the like.

The eccentric transmission mechanism 50 transmits a rotational force of the lock drive mechanism 70 to the T-shaped key 14c (14d), even if the position adjusting plate 13B moves from its original position within a movable range in the direction vertical to the plane.

Here, as shown in FIG. 2, the lock drive mechanism 70 is provided with a motor 71, a drive screw 73 to which the rotation of the motor 71 is transmitted by a belt 72, a slide axis 74 arranged in parallel with the drive screw 73, a moving block 75 freely slidably supported in the slide axis 74 and driven by a drive screw 73, a bearing 76 secured on a moving block 75 and engaging a long hole in the transmission lever 51, and the like.

When the bearing 76 is in the position (a), the rotation lever 52 is in the position (a). When the bearing 76 moves to the right and comes to the position (b), the rotation lever 52 rotates. This causes the transmission lever 51 to move that distance and to descend to the point indicated by a chain line connected by two dots. Because the bearing 76 is secured on the moving block 75, the horizontal level of the position (b) remains the same as that of the position (a). Because of this, a deviation of the engaging position of the transmission lever 51 and the bearing 76 is absorbed by the long hole of the transmission lever 51.

Figure 7:
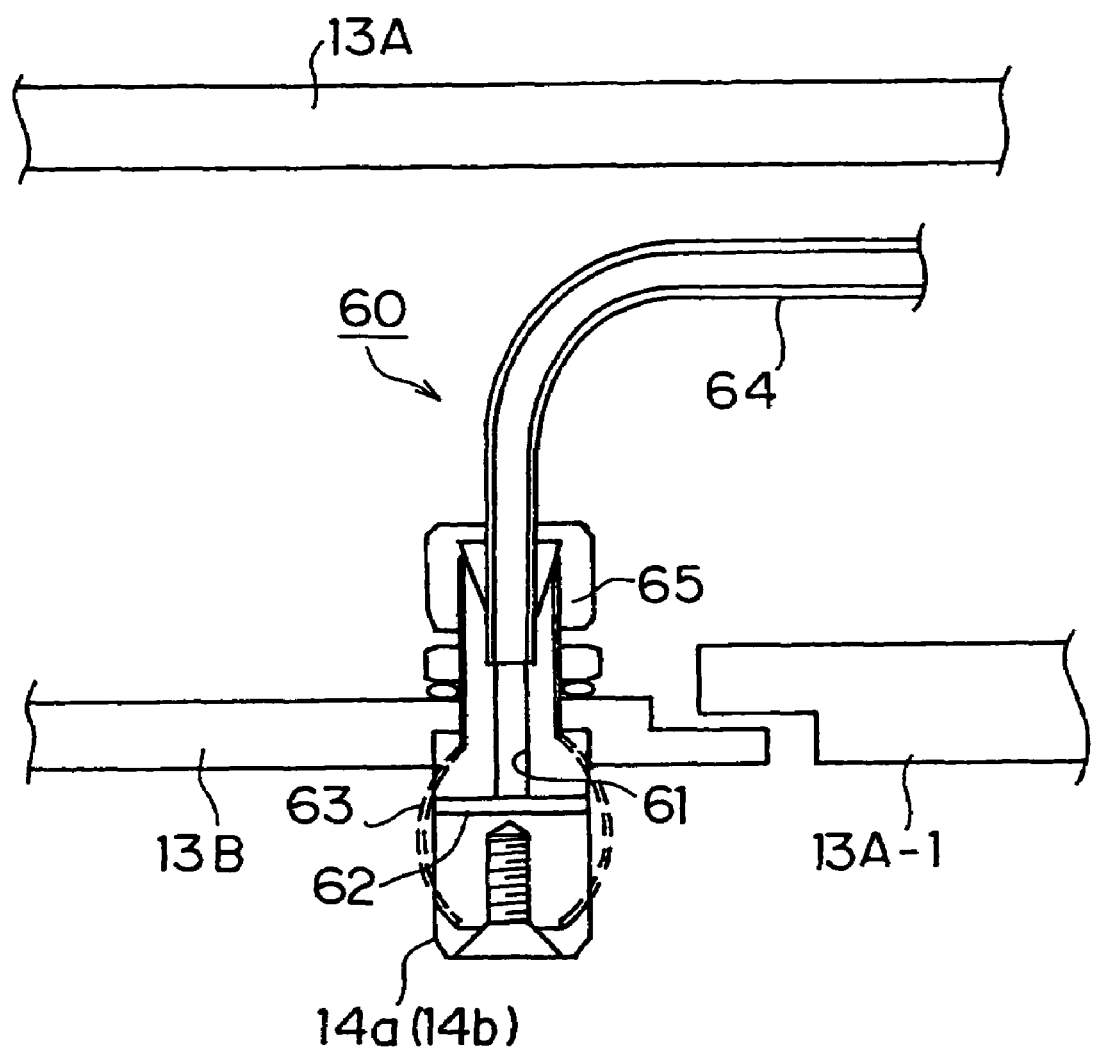
FIG. 7 is a cross sectional view along the line VII-VII of FIG. 2 and shows the positioning securing means of the pod cover removing-installing apparatus of the first embodiment.

FIG. 7 is a cross sectional view along the line VII-VII of FIG. 2 and shows the positioning securing means of the pod cover removing-installing apparatus of the first embodiment.

The position securing means 60 secures the positioning pins 14a, 14b in the pin holes 204a, 204b when the positioning pins 14a, 14b engage the pin holes (the parts to be engaged) 204a and 204b of the pod 200 and their positions are determined.

The position securing means 60 of this embodiment has a passage 61 provided in the axial direction of the positioning pin 14a (14b), a passage 62 provided in the vertical direction of the passage 61 and joining therewith, a stretch member 63 formed from rubber such as neoprene provided around the circumference of the positioning pin 14a (14b) and capable of stretching according to an increase or decrease in the internal pressure, a pipe 64 connected with the passage 61, a securing member 65 for securing the pipe 64 at the rear end of the positioning pin 14a (14b), and the like.

In this position securing means 60, pipe 64 is connected to a pneumatic circuit or a vacuum circuit, not shown in the figure, which causes the internal pressure of the passages 61, 62 to increase or decrease, thereby causing the stretch member 63 to expand or contract, causing the gap between the positioning pins 14a, 14b and the pin holes 204a, 204b to be filled out. The positioning pins 14a, 14b are secured in the position in this manner.

Figure 8:
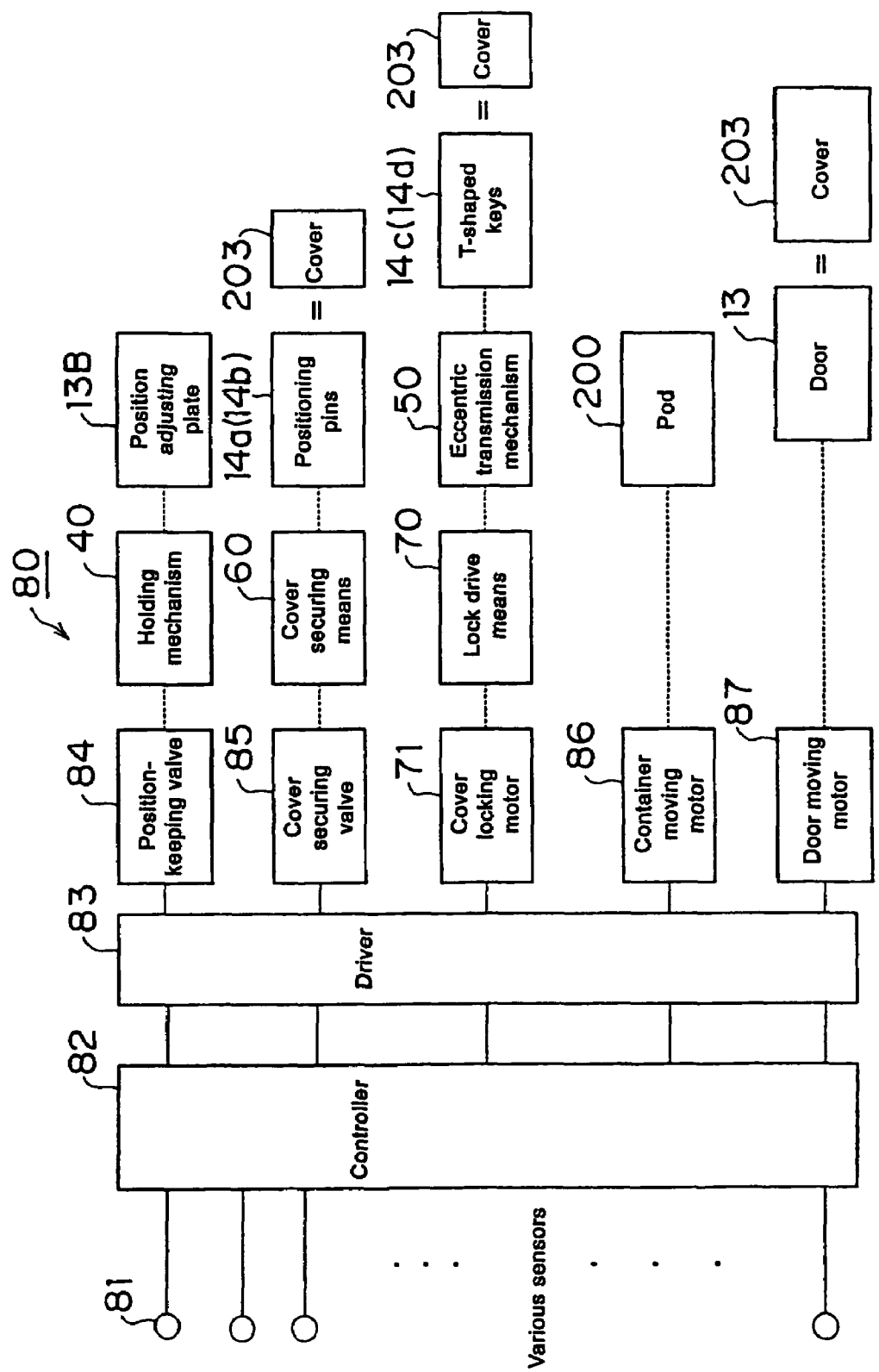
FIG. 8 is a block diagram showing a control means for the pod cover removing-installing apparatus of the first embodiment.

FIG. 8 is a block diagram showing a control means for the pod cover removing-installing apparatus of the first embodiment, and FIGS. 9-12 are flow charts showing operations of the cover removing-installing apparatus.

The control means 80 has various sensors 81 for detecting the positions and the like of each moving part, a controller 82 which produces various control signals to control each drive part, described later, based on the position detection signals from the sensors 81, a driver 83 for converting control signals from the controller 82 into drive signals conforming to each drive part, and a drive part driven based on the drive signals from the driver 83, including a position-keeping valve 84 which controls the flow of the air pressure to the holding mechanism 40, a cover securing valve 85 which controls the flow of the air pressure to a cover securing means 60, a cover locking motor 71 of a lock drive means 70, a container moving motor 86, a door moving motor 87, and the like.

Figure 9:
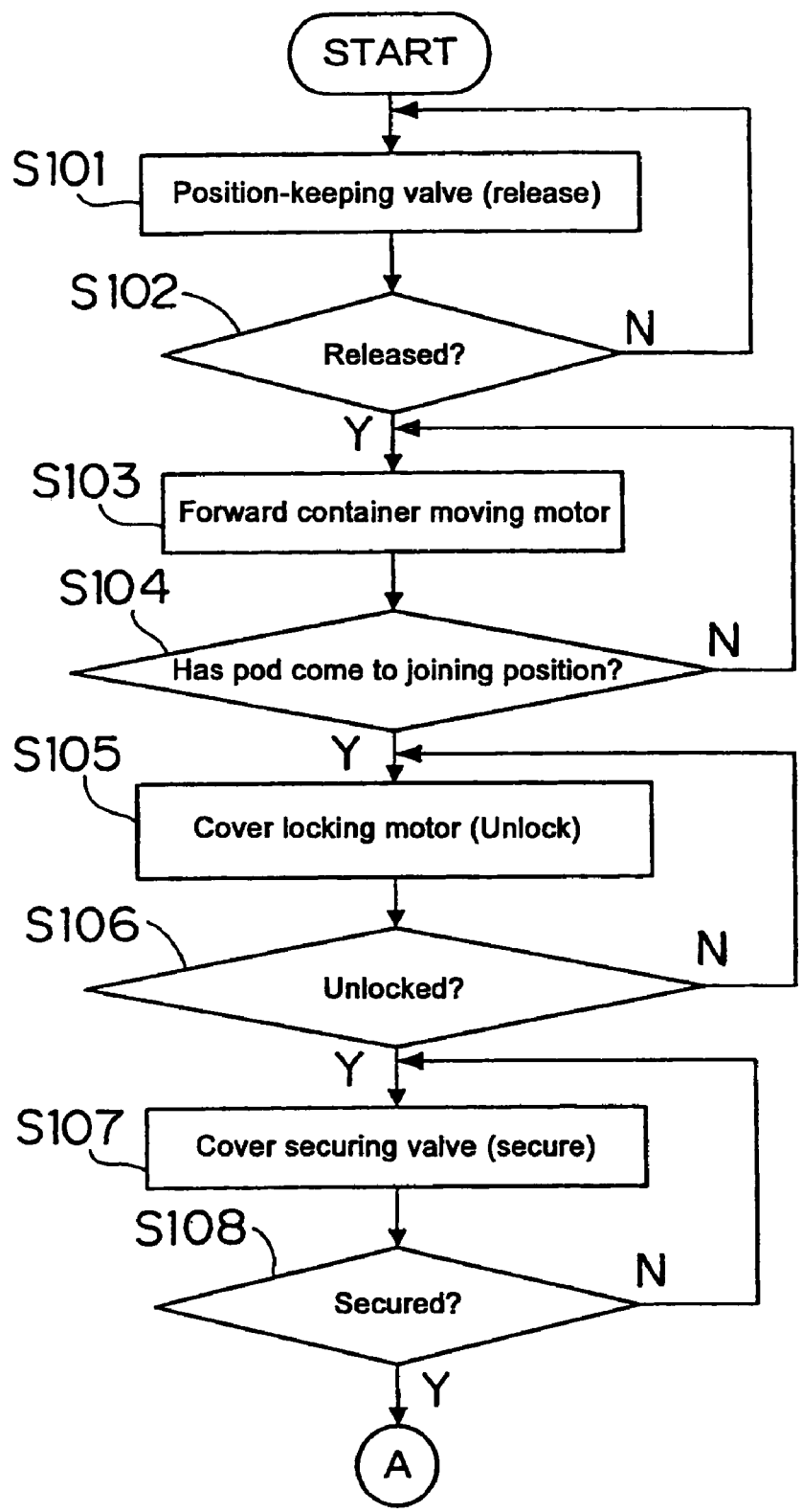
FIG. 9 is a flowchart showing an operational example (cover opening operation 1) for the pod cover removing-installing apparatus of the first embodiment.

Next, the cover opening operation will be described referring to FIGS. 9 and 10.

The controller 82 drives the position-keeping valve 84 to the release side (Step 101, the step is hereinafter referred to as "S") and, upon confirmation of release with a sensor (S102, YES), drives the container moving motor 86 to move the pod 200 forward (S103), then, upon confirmation that the pod 200 has come to the joining position (S104, YES), stops the container moving motor 86.

Because the holding mechanism 40 is canceled in this state by the position-keeping valve 84, the position adjusting plate 13B is not only free, but also has been moved to the center by the centering mechanism 30. When the pod 200 comes to the joining point, the position adjusting plate 13B can be moved by the fine adjustment mechanism 20, enabling the complete joining of the cover 203 of the pod 200 and the door 13 even though the pin holes 204a and 204b of the pod 200 deviate in the allowable range with respect to the positioning pins 14a, 14b.

Next, the cover locking motor 71 is driven to the unlock side (S105) and the T-shaped keys 14c and 14d are rotated to retract the nails 204e-204h of the cover 203. When the sensor confirms that the nails 204e-204h have been retracted (unlock) (S106, YES), the cover securing valve 85 is driven to the securing side (S107) to expand the stretch member 63 of the positioning pins 14a, 14b, confirming the securing of the pin holes 204a, 204b with the sensor (S108, YES).

In the final stage of the operation S107, even if there is a deviation between the positioning pins 14a, 14b and pin holes 204a, 204b, and the position adjusting plate 13B has been moved, the T-shaped keys 14c, 14d can rotate due to the eccentric transmission mechanism 50.

Moreover, accurate positioning is possible because the pin holes 204a, 204b are secured by expanding the stretch member 63 of the positioning pins 14a, 14b.

Figure 10:
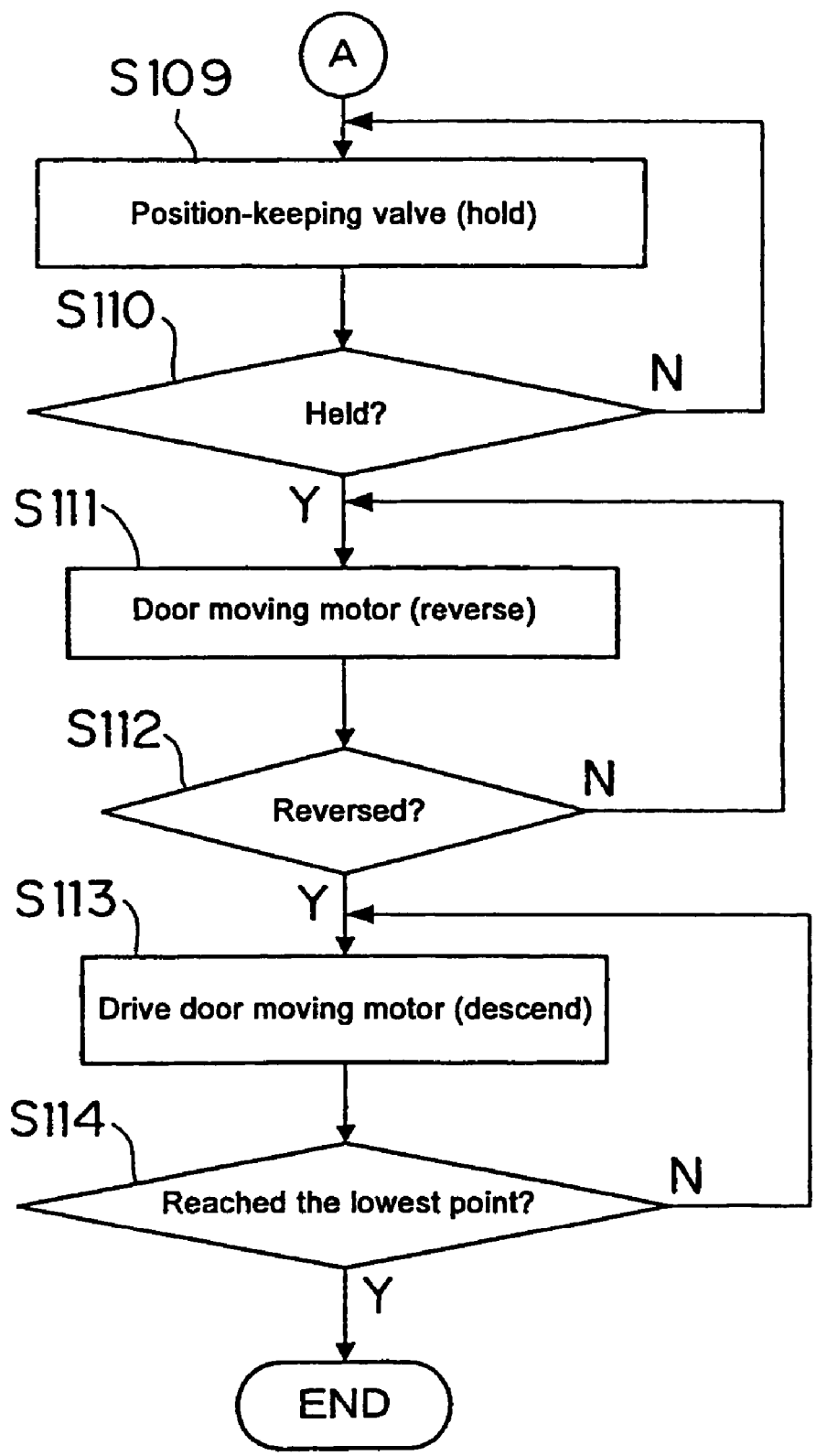
FIG. 10 is a flowchart showing an operational example (cover opening operation 2) for the pod cover removing-installing apparatus of the first embodiment.

Next, as shown in FIG. 10, the position-keeping valve 84 is driven to the hold side (S109), confirming the holding with the sensor (S110, YES), and causing the door to reverse by driving the door moving motor 87 (S111). Upon confirmation that the door has reversed (S112, YES), the door moving motor 87 is further driven to move the door downward (S113). When the door has reached the lower limit (S114, YES), the operation to terminate the process is stopped.

In this state, the position-keeping valve 84 is driven to the hold side and holds the position of the position adjusting plate 13B in its original position in the later-described door closing operation. Therefore, the door does not collide with the opening 202 of the pod 200 when closed.

Next, the cover closing operation will be described referring to FIGS. 11 and 12.

Figure 11:
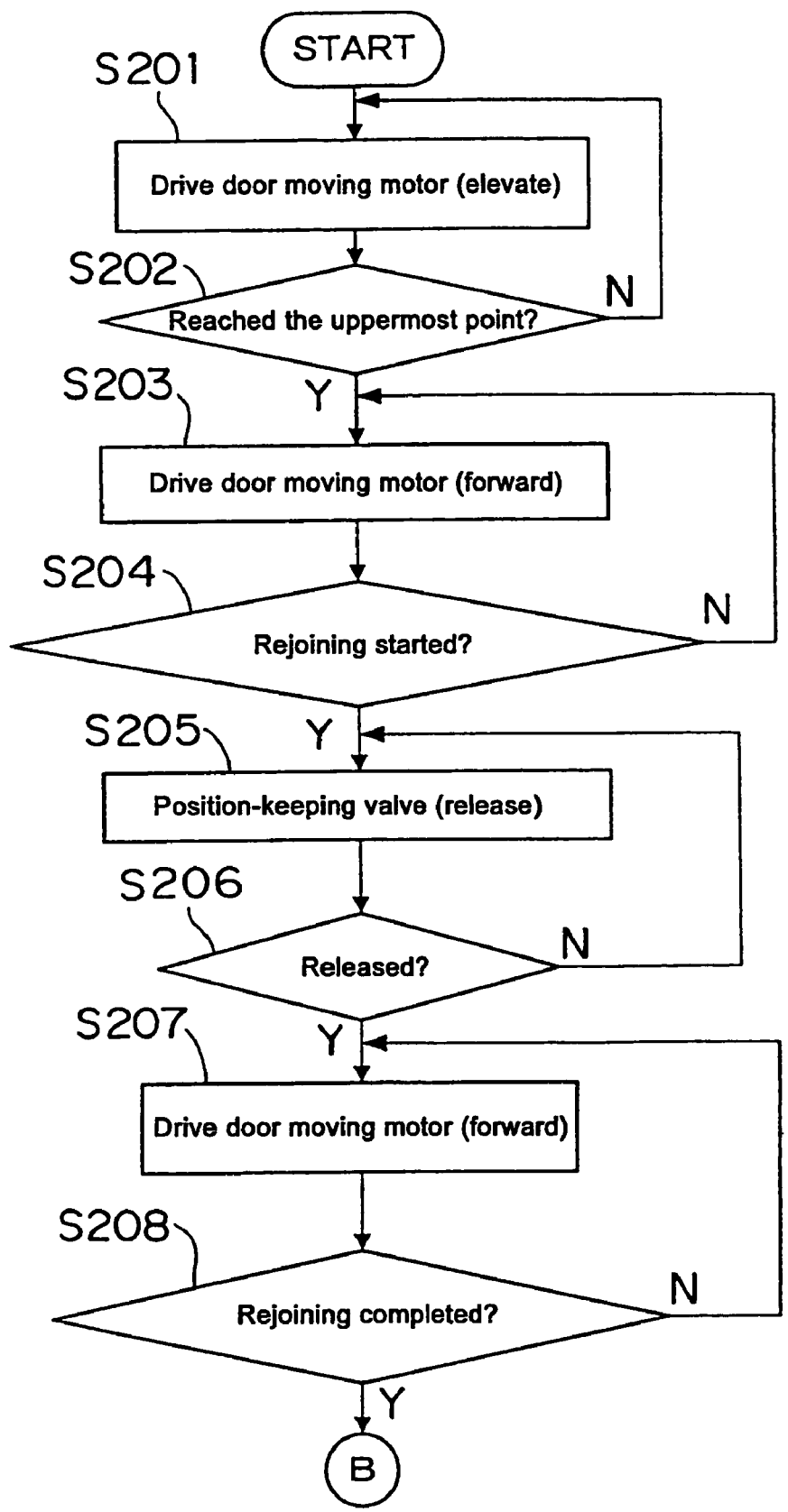
FIG. 11 is a flowchart showing an operational example (cover closing operation 1) for the pod cover removing-installing apparatus of the first embodiment.
Figure 12:
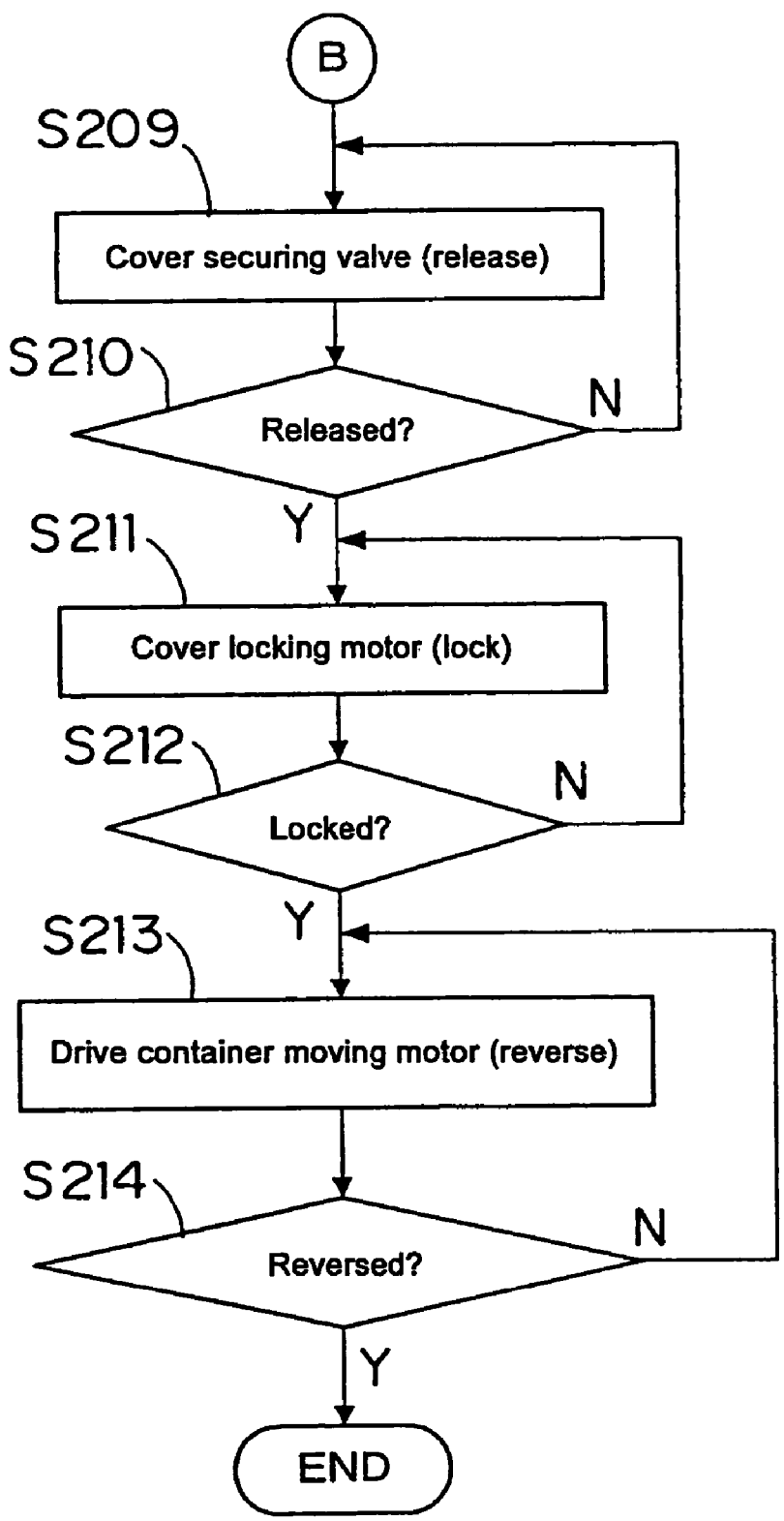
FIG. 12 is a flowchart showing an operational example (cover opening operation 2) for the pod cover removing-installing apparatus of the first embodiment.

Referring to FIG. 11, the controller 82 drives the door moving motor 87 to elevate (S201) to the upper limit point (S202, YES), then to go forward (S203) until it starts rejoining the pod 200. Upon confirmation of the initiation of rejoining by a sensor (S204, YES), the position-keeping valve 84 is driven to the release side (S205). Upon confirmation of the release by a sensor (S206, YES), the door moving motor 87 is driven forward (S207) until rejoining is complete, whereupon the door moving motor 87 is stopped and the rejoining with the pod 200 is confirmed by a sensor (S208).

Next, the cover securing valve 85 is driven to the release side (S209) to cause the stretch member 63 of the positioning pins 14a, 14b to become contracted. The release from the pin holes 204a, 204b is confirmed by a sensor (S210, YES). The cover locking motor 71 is driven to the lock side (S211) to rotate the T-shaped keys 104c, 104d and cause the nails 204e to 204h to protrude and lock the cover, which is confirmed by a sensor (S212, YES).

Finally, the container moving motor 86 is driven to move the pod 200 backward (S213). Upon confirmation by a sensor that the pod 200 has reversed (S104, YES), the container moving motor 86 is stopped to terminate the cover closing operation.

Second Embodiment

Figure 13:
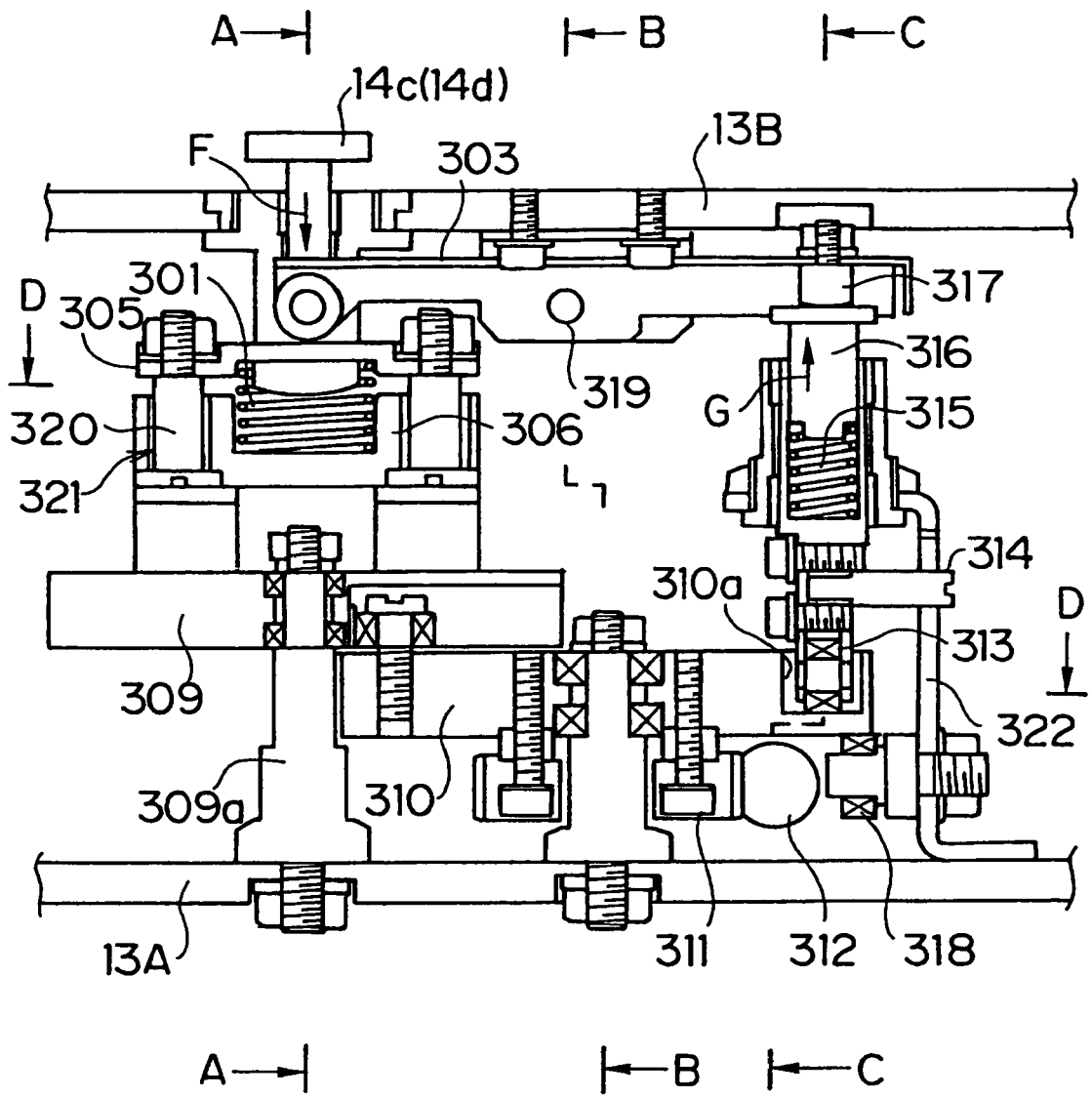
FIG. 13 is a front view showing the main part of a second embodiment of the cover removing-installing apparatus for a pod of the present invention.
Figure 14B:
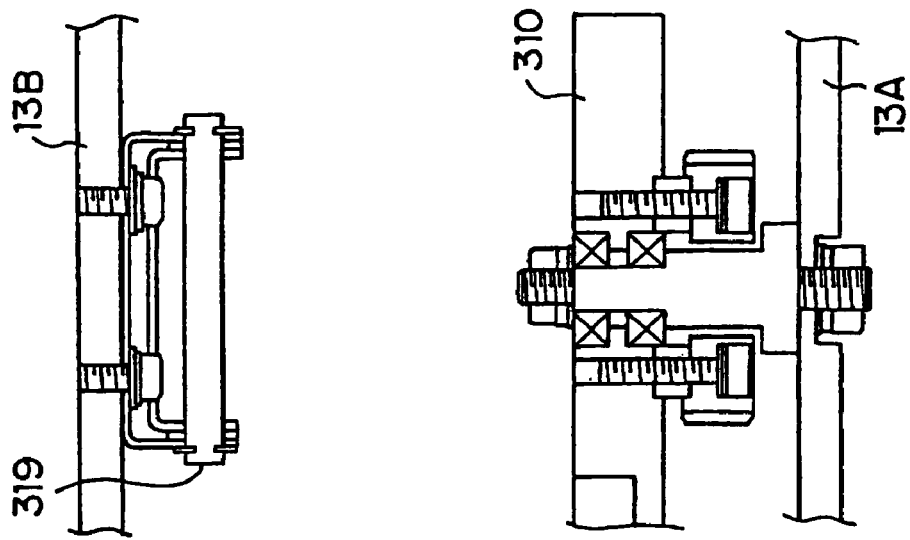
FIG. 14(b) is a cross sectional view along the line B-B of FIG. 13.
Figure 14A:
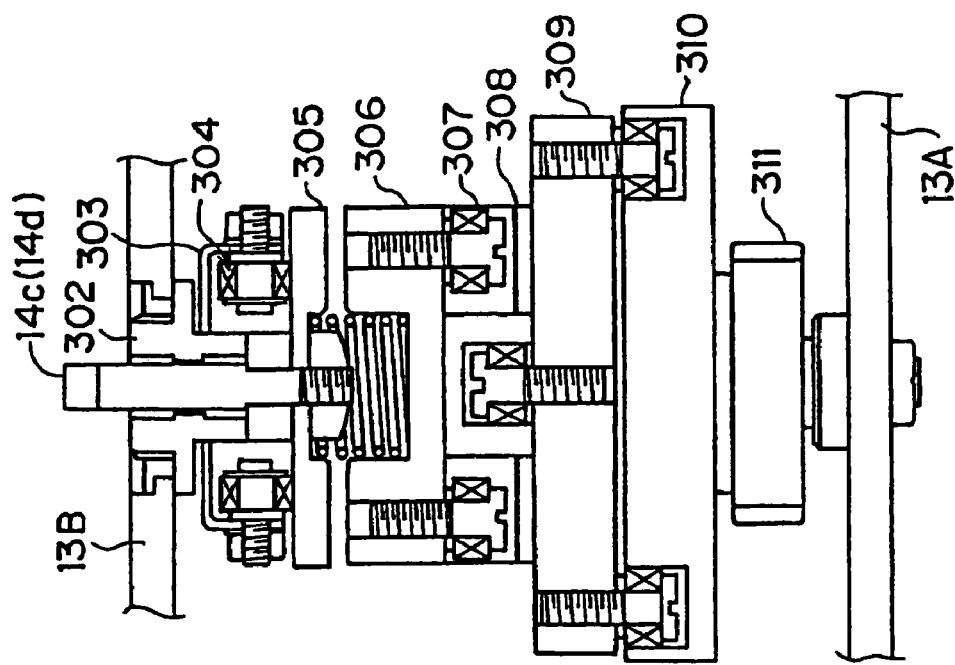
Figure 16:
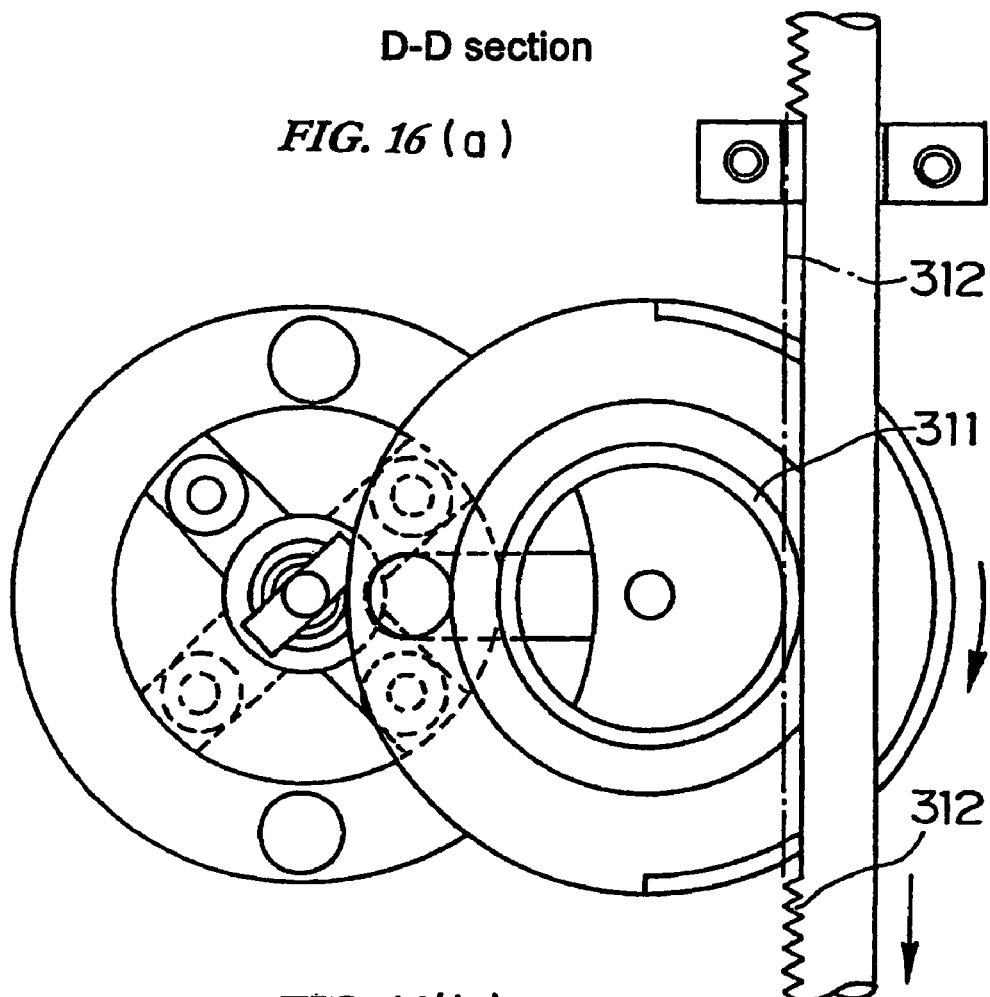
FIGS. 16(a) and (b) are cross sectional views along the line D-D of FIG. 13 showing the main part of the second embodiment of the cover removing-installing apparatus for a pod of the present invention.
Figure 16:
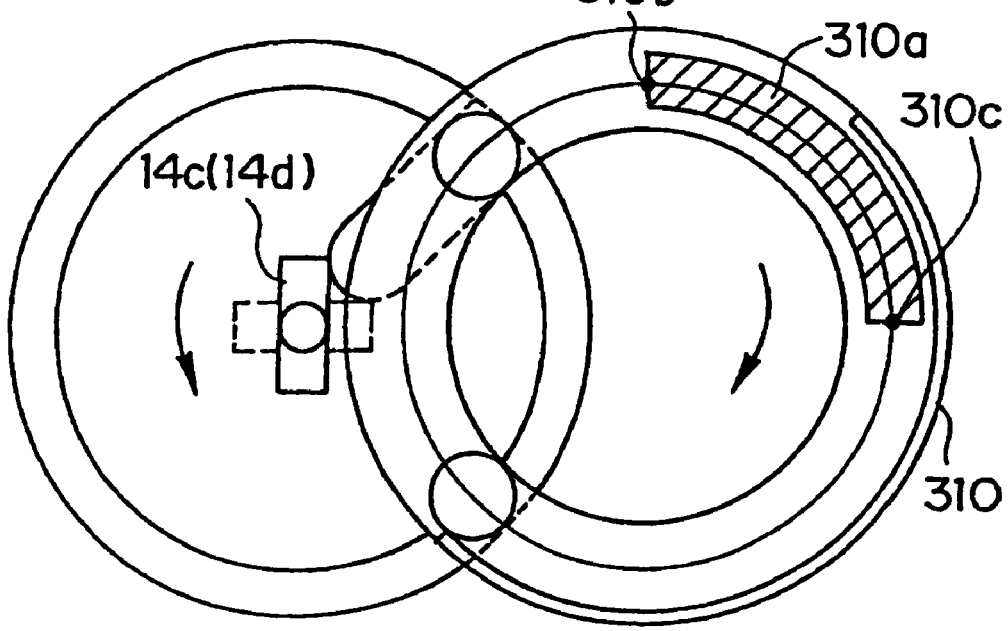

FIGS. 13-16(a) and (b) show the main parts of the pod cover removing-installing apparatus of the second embodiment, wherein FIG. 13 is a front view, FIG. 14(a) is a cross sectional view along the line A-A of FIG. 13, FIG. 14(b) is a cross sectional view along the line B-B of FIG. 13, FIG. 15(a) is a view from the direction of the arrow E of FIG. 15(b), FIG. 15(b) is a cross sectional view along the line C-C of FIG. 13, and FIGS. 16(a) and (b) are cross sectional views along the line D-D of FIG. 13.

The second embodiment of the pod cover removing-installing apparatus has, in addition to the structure of the first embodiment, a cover securing means which secures the cover 203 to the door 13 by retracting the lock pins 13a, 13b (by pulling down in FIG. 13) to the door 13 side.

A linear motion from a drive means, not shown in the drawing, to a rack 312 in FIG. 13 rotates a pinion gear 311 which engages the rack 312. A disc 310 is coaxially screwed to the pinion gear 311.

The disc 310 can rotate by 180°, causing the T-shaped key 14c (14d) to rotate in the first 90° rotation and drawing the T-shaped key 14c (14d) to the direction of the arrow F in the next 90° rotation, thereby securing the cover 203 to the door 13 (the cover securing means).

A disc 309 is installed on an axis 309a in a freely rotative manner within an angle of 90°. The axis 309a is screwed to the base plate 13A. A rotation from the disc 310 is transmitted to the disc 309 via a rotor (bearing) which is screwed to the groove formed on the bottom of the disc 309 and the top of the disc 310.

A rotating disc 306 is connected to the rotating disc 309 via a moving body 308 and a bearing 307, as shown in FIG. 14(a). The moving body 308 and the bearing 307 allow the rotation of the rotating disc 309 and the rotating disc 306, even if these deviate in any direction, i.e. up and down, right and left, or front and back.

Because not only the disc 305 is connected to the disc 306 via a support 320 and a bush 321 (FIG. 13), but also these parts are pressed together by a spring, the discs 305 and 306 rotate as an integral body.

The T-shaped key 14c (14d) is held on a holding base 302 movable in the axial direction. A push-down board 303 is connected to the holding base 302. The push-down board 303 is provided with a bearing 304 which maintains contact with the surface of the disc 305 while rotating. The disc 305 is pushed upward by the spring 301. The contact of the disc 305 with the holding base 302 ensures accurate determination of the position of the T-shaped key 14c (14d) in the axial direction.

The T-shaped key 14c (14d) rotates 90° by a first 90° rotation of the disc 310 according to the above mechanism to complete a lock (or unlock) operation. In this instance, the rotation can be transmitted even if the rotating disc 309 and the rotating disc 306 deviate in any direction (up and down, right and left, or front and back) due to the existence of the moving body 308 and the bearing 307 (eccentric transmission mechanism).

As shown in FIGS. 13 and 15(a) and (b), a roller 318 is attached to a bracket 322 provided in the base plate 13A and comes into contact with the bottom of the disc 310 to prevent downward deflection of the disc 310.

A groove 310a is formed on the surface of the disc 310 as shown in FIG. 16(b). The bottom of the groove 310a slopes from the highest point 310b to the lowest point 310c. A bearing 313 enters the groove 310a and moves. The bearing 313 is installed on the bottom of the support member 324 which is provided in a freely slidable manner in the collar 323 installed on the bracket 322. The support member 324 has a cylindrical upper portion into which a support column 316 is inserted through a spring 315. A pin 314 is provided in the support member 324 to prevent its rotation. Because the pin 314 engages a long hole provided in the bracket 322, the support member 324 does not rotate even if it moves up and down.

A base seat 317 is screwed to a push-down board 303, with the bottom in contact with the top of the support member 316. The push-down board 303 is freely rotatively supported by a pin 319 and rotates counterclockwise in the FIG. 13 by a force pressing the base seat 317 upward (arrow G), thereby transmitting a push-down force (arrow F) to a bearing 304 which is provided on the other end.

Specifically, the push-down board 303 pushes down the T-shaped key 14c (14d) via the above-described mechanism in the next 90° rotation of the disc 310, whereby the cover 203 of the pod 200 may be secured to the door 13.

The second embodiment enables one driving force to cause rotation of the T-shaped key 14c (14d) and a pull-in operation of the T-shaped key 14c (14d) to secure the cover 203 to the door 13. In addition, the apparatus of the second embodiment is also provided with an eccentric transmission mechanism which allows deviation of the base plate 13A and the position adjusting plate 13B.

Third Embodiment

Figure 17:
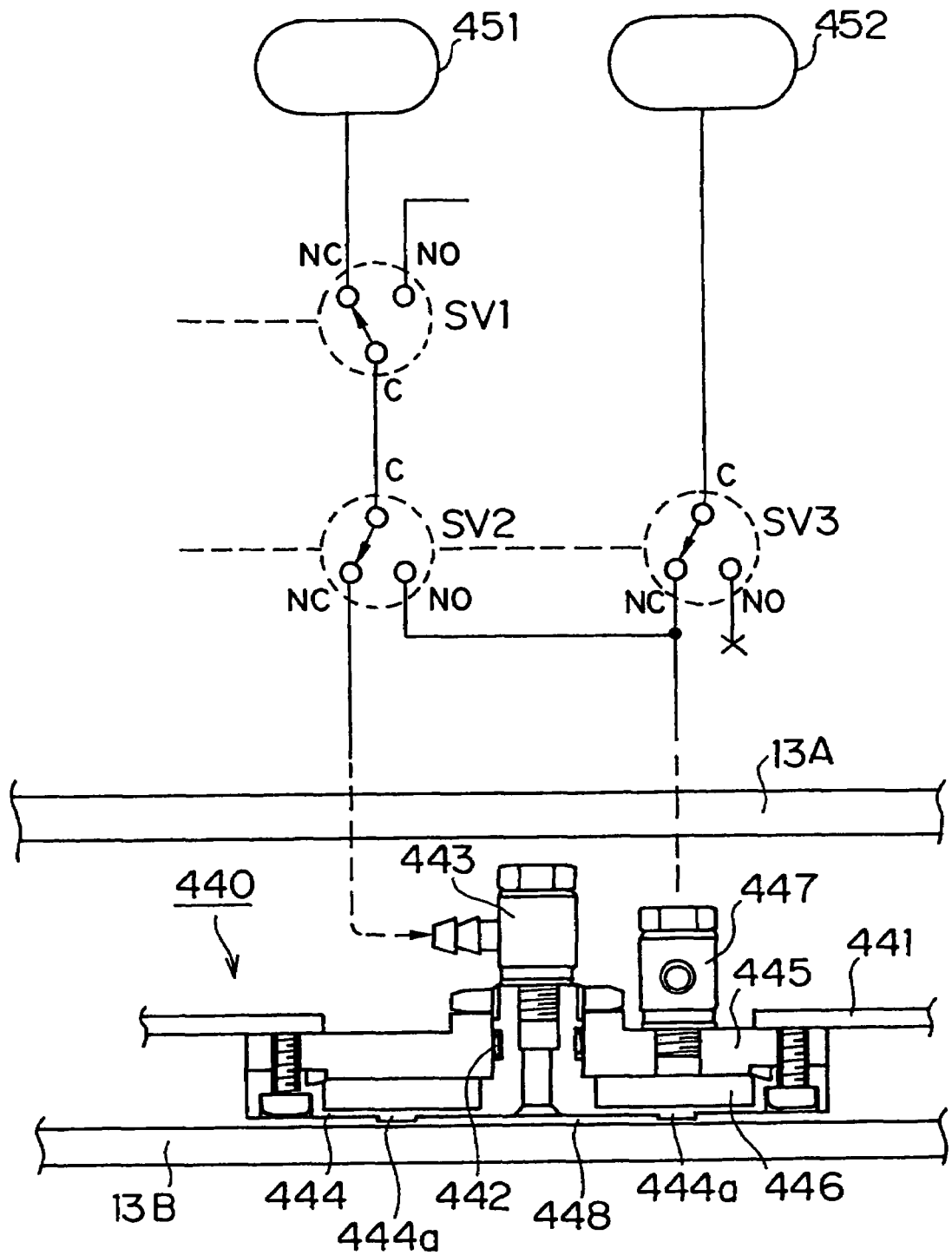
FIG. 17 shows a holding mechanism of the pod cover removing-installing apparatus according to the third embodiment.

FIG. 17 shows a holding mechanism of the pod cover removing-installing apparatus according to a third embodiment.

A holding mechanism 440 has a securing plate 441 provided in a base plate frame (not shown), a base plate 445 provided on the securing plate 441, a main body 443 connected to the base plate 445 through an O-ring 442 and having a nozzle connected to a vacuum pressure source 451, an absorption pad 444 provided in the main body 443 and having a seat 444a to attach to the position adjusting plate 13B.

In this embodiment, a space 446 is formed between the absorption pad 444 and the base plate 445. The base plate 445 is provided with a nozzle 447 to connect the space 446 to an air pressure source 452.

A vacuum pressure source 451 is connected to the nozzle 443 of the main body 443 through solenoid valves SV1 and SV2. The air pressure source 452 is connected to the nozzle 447 through a solenoid valve SV3.

The NC port of the solenoid valve SV1 spacially communicates with the vacuum pressure source 451, the NO port with the atmosphere, and the C port with the C port of the solenoid valve SV2. The NC port of the solenoid valve SV2 spacially communicates with the nozzle 443, and the NO port with NC port of the solenoid valve SV3. The C port of the solenoid valve SV3 spacially communicates with the air pressure source 452 and the NO port is shut off.

If the solenoid valves SV1, SV2, and SV3 are on the NC port side as shown in FIG. 17, with the vacuum pressure source 451 being evacuated and high pressure air being supplied from the air pressure source 452, the seat 444a of the adsorption pad 444 is pushed to the position adjusting plate 13B side by the pressure of the space 446 and the pressure of the space 448 inside the seat part 444a becomes negative, thereby accelerating the adherence of the adsorption pad 444.

On the other hand, if the solenoid valve SV1 is switched to the NO port side to open the space 448 to the atmosphere, then the solenoid valves SV2, SV3 are switched to the NO port side to open the space 446 to the atmosphere, the solenoid valve SV1 is switched to the NC port side, and the space 446 is adsorbed to accelerate release of the adsorption pad 444.

The third embodiment thus accelerates the adherence and release operations of the position adjusting plate 13B. In addition, because the seat part 444a separates from the position adjusting plate 13B during the release operation, the position adjusting plate 13B can move smoothly.

Fourth Embodiment

Figure 18C:
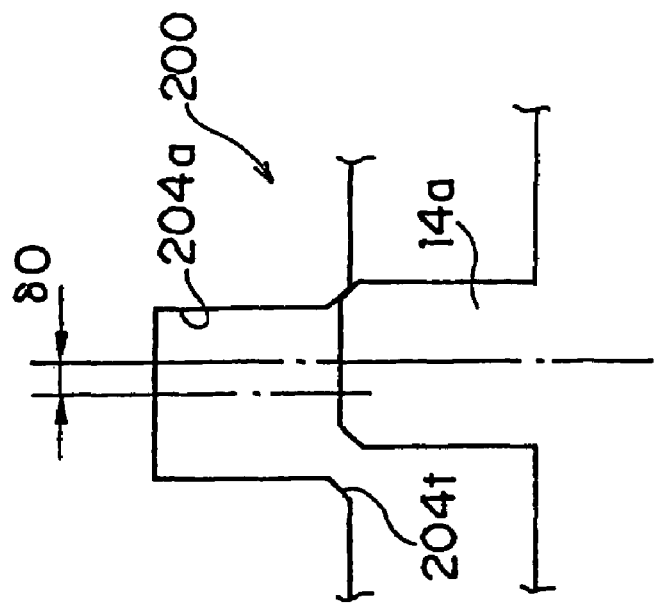
FIGS. 18(a), (b), and (c) are drawings showing a positioning member of the pod cover removing-installing apparatus according to the fourth embodiment.
Figure 18B:
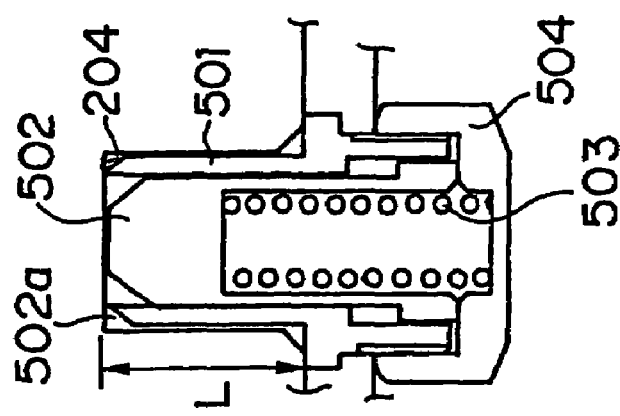
Figure 18A:
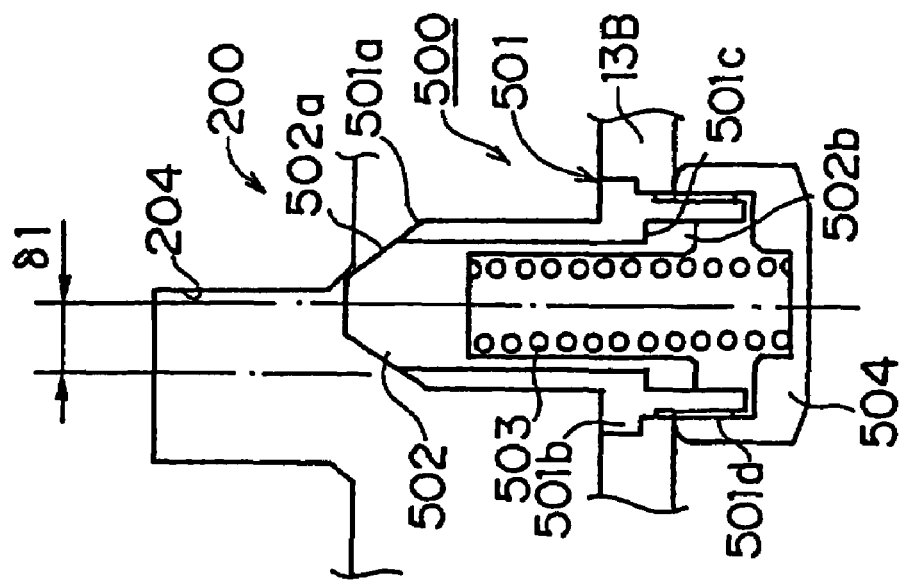

FIGS. 18(a), (b), and (c) show a positioning member of the pod cover removing-installing apparatus according to a fourth embodiment.

FIG. 18(c) shows a conventional system. In this system, if the deviation of the positioning pin 14a and the pin hole 204a becomes larger than $\delta 0=1$-$1.5$ mm, the positioning pin 14a may not smoothly enter the pin hole 204a depending on a taper 204t of the pin hole 204a on the pod 200 side.

A positioning member 500 of the fourth embodiment is provided with an outer casing 501 and an inner casing 502. The outer casing 501 is a cylinder having a taper 501a formed on the tip, a brim 501b formed on the outside, a step 501c formed inside, a thread part 501d formed in the back of the brim 501b, and the like, and is secured to the positioning plate 13B using the brim 501b.

The inner casing 502 is a cylinder inserted into the outer casing 501 and has a taper 502a having the same angle as the taper 501a of the outer casing 501, and a brim 502b formed on the outside of the end, wherein the brim 502b engages the step 501c to regulate the protrusion to a prescribed length.

A spring 503 inserted in the inner casing 502 pushes the inner casing 502 in the protrusion direction. A box nut 504 thrust in a thread 501d of the outer casing 501 secures the outer casing 501 to the position adjusting plate 13B and regulates the location of the end of the spring 503.

As shown in FIG. 18(a), because the outer casing 501 and the inner casing 502 are provided with a taper 501a or 502a having the same angle which is more acute than the conventional angle and a length longer than a conventional one, these are smoothly linked even if the deviation is in the range of $\delta 1=3.0$-$3.5$ mm.

As shown in FIG. 18(b), because the inner casing 502 escapes resisting the pushing force of the spring 503 after the completion of linking, the depth of the pin hole 204a may be the same depth (L=11 mm) as the pin hole of the conventional pod 200.

Fifth Embodiment

Figure 19B:
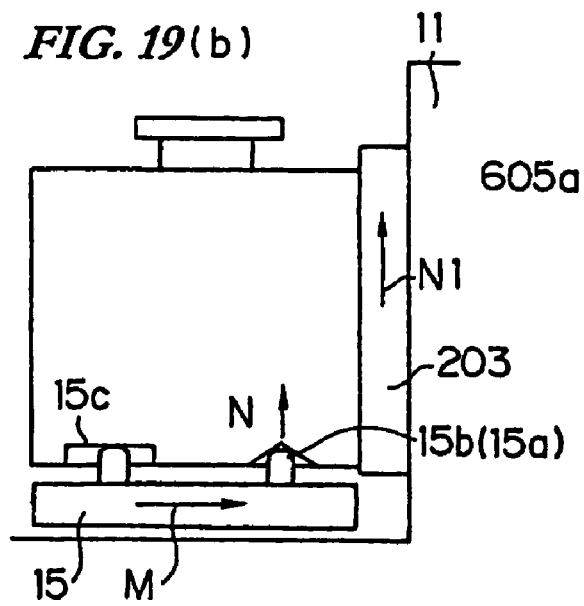
FIGS. 19(a), (b), (c), and (d) are drawings showing a table positioning member of the pod cover removing-installing apparatus according to the fifth embodiment.
Figure 19A:
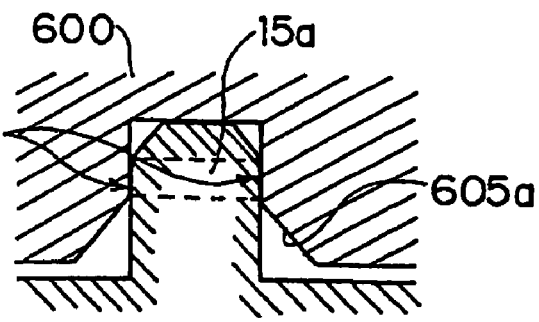
Figure 19C:
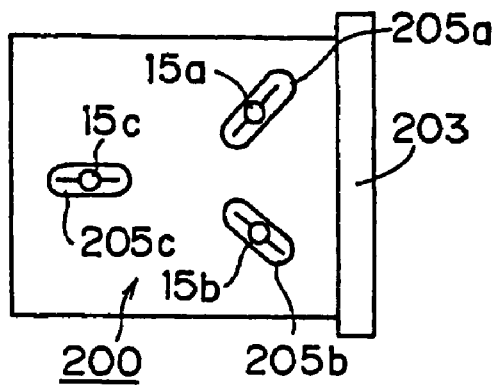

FIGS. 19(a), (b), (c), and (d) show a positioning member for the table of the pod cover removing-installing apparatus according to a fifth embodiment.

The positioning pins 15a-15c of the table 15 (see the table 105 of FIG. 21) are arranged as shown in FIG. 19(b). For this reason, when the table 15 moves in the direction of the arrow M, a force pushing up the pod 200 in the direction of the arrow N (N1) is generated in the V-shaped grooves 205a, 205c. However, no excessive force is produced by the V-shaped groove 205c which is parallel to the moving direction.

Figure 19D:
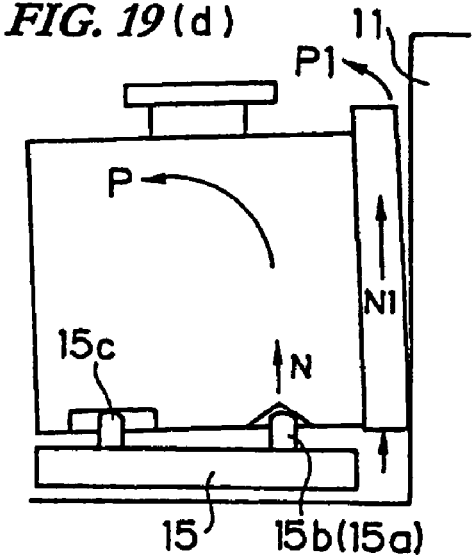

As a result, a rotation force around the positioning pin 15c in the direction of the arrow P (P1) is created in the pod 200 as shown in FIG. 19(d). Because of this, the top end of the pod 200 may be separated from the partition board 11, resulting in problems such as defective sealing.

In the fifth embodiment, because the vertical fixed side 605a-1 (605b-1, 605c-1) provided in the V-shaped groove 605a (605b, 605c) formed on the bottom surface of the pod 600 enables the pod 600 to come into contact with the vertical fixed side 15a-1 (15b-1, 15c-1) of the positioning pin 15a (15b, 15c) (a bonding posture corrective means), no force pushing the pod 600 upward is created even if the container is pushed in the horizontal direction.

Sixth Embodiment

Figure 20A:
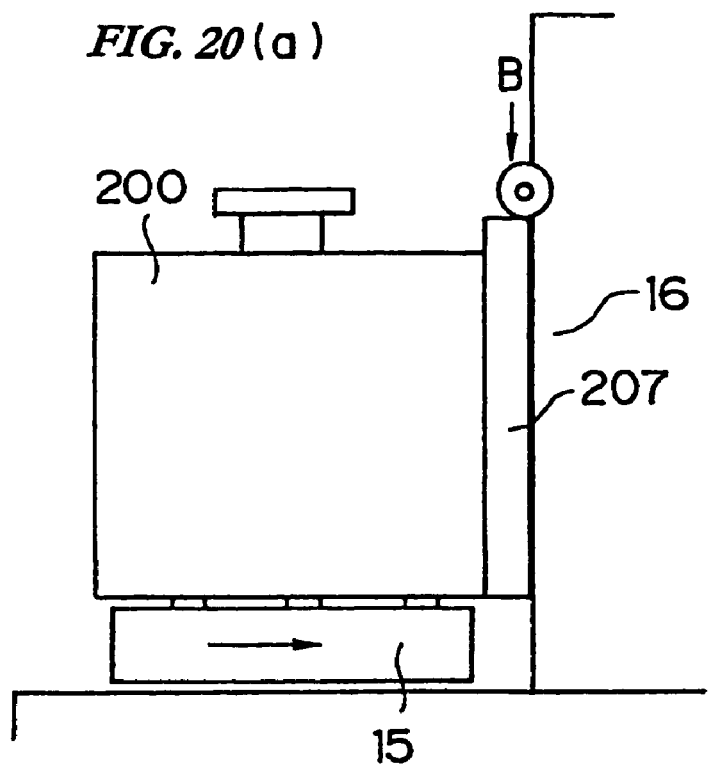
FIGS. 20(a) and (b) are drawings showing a positioning member of the pod cover removing-installing apparatus according to the sixth embodiment.
Figure 20B:
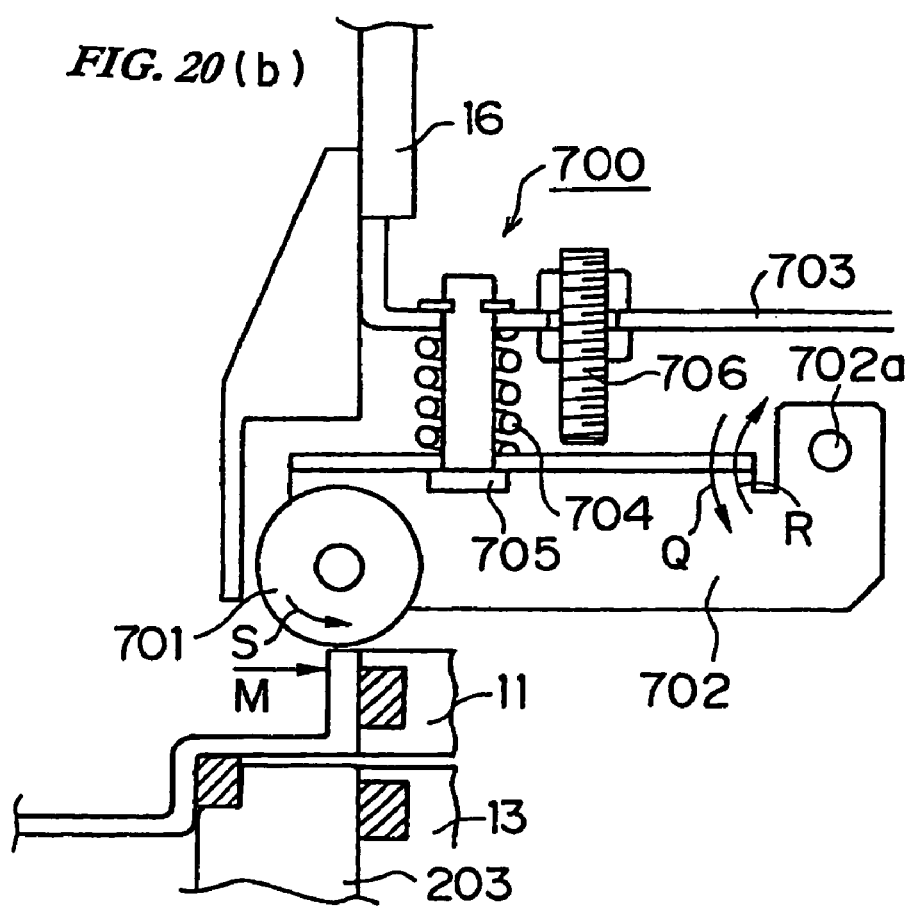

FIGS. 20(a) and (b) show a positioning member of the pod cover removing-installing apparatus according to a sixth embodiment.

The fifth embodiment cannot be applied to a pod 200 which has already been used. Modification of the types and the like is necessary to change such a pod. For this reason, the sixth embodiment is provided with a binding posture corrective mechanism 700 which corrects the linking position of the pod 200.

The binding posture corrective mechanism 700 is provided with a rotor 701 such as a bearing provided on the top and side of the door frame 16 connected to the cover frame 207 of the pod 200 and maintaining contact with the cover frame 207, a moving board 702 rotatively supporting the rotor 701 on the left end thereof and rotatively supported by the axis 702a at the upper right end, a linking member 705 which links the moving board 702 with a fixed board 703 so that the rotor 701 always presses the cover frame 207 with a spring 704 between them and regulates the counterclockwise rotation (arrow Q) of the moving board 702, a regulating member 706 provided on the fixed board 703 to regulate the clockwise rotation (arrow R) of the moving board 702, and the like.

The rotor 701 can not only freely move in the moving direction (arrow M) on the table 15 by its rotation, but can also freely move in the right angle direction of the arrow M by the rotation of the moving board 702. The rotor 701 is arranged so that it always presses the pod 200 by a spring 704. In addition, the movable range for the rotor 701 is limited via a movable board 702 to the minimum push-out position of the linking member 705 and the maximum push-out position of the regulating member 706.

Therefore, the top and the side of the pod 200 can be pressed in the linked position so that the pod 200 is held in a normal posture ready to be linked.

Modification

The present invention is not limited to the above-described embodiments and can be varied or modified in various ways. Such variations and modifications are within the scope of equivalency of the present invention.

For example, although the cover securing means was described in FIG. 7 using a stretch member 63 by way of example, a modified type having a broken part in the positioning pin 14a (14b) to mechanically change the diameter of the positioning pin 14a (14b) can be used for securing the pins in the pin holes.

Obviously, numerous modifications and variations of the present invention are possible in light of the above teachings. It is therefore to be understood that, within the scope of the appended claims, the invention may be practiced otherwise than as specifically described herein.

What is claimed:

1. A pod cover removing-installing apparatus to remove and install a cover for an opening of a pod, an inside of which is kept extremely clean, by causing the cover to engage a door for an opening of a high cleanliness room, while maintaining high cleanliness of the pod and the room by closely attaching a circumference of the two openings, the pod cover removing-installing apparatus comprising:

a positioning member to determine a position of the cover;

a fine adjustment mechanism to finely adjust the position of the positioning member; and a holding mechanism to hold the position of the cover mated with the door of the high cleanliness room, wherein the positioning member includes:
an outer casing with a tapered end;
an inner casing installed freely movable in an axial direction of the outer casing, having a taper with an angle measuring the same as the taper of the outer casing at the tapered end and arranged so that the two tapers become continuous when protruding; and
a pushing device to push the inner casing in a protruding direction.

2. The pod cover removing-installing apparatus according to claim 1, further comprising:

a movable pod table having the pod installed thereon; and
a linking pin provided on the pod table,
wherein the linking pin is substantially vertically aligned with respect to a moving direction of the pod table and comes in contact with a fixed side which is substantially vertically aligned with respect to the moving direction of the pod table, and the fixed side is provided in a V-section groove provided on a bottom of the pod.

3. The pod cover removing-installing apparatus according to claim 1, further comprising:

a linking posture corrective device to correct a linking posture of the pod, wherein the linking posture corrective device includes a pressing member provided on a periphery of the door to press a top and/or a side of the cover of the pod and capable of freely moving in a moving direction of a pod table and in a direction vertical thereto within a prescribed movable range.

4. A pod cover removing-installing apparatus to remove and install a cover for an opening of a pod, an inside of which is kept extremely clean, by causing the cover to engage a door for an opening of a high cleanliness room, while maintaining high cleanliness of the pod and the room by closely attaching a circumference of the two openings, the pod cover removing-installing apparatus comprising:

a lock member to lock the cover by engaging the same;
a cover securing device to secure the cover to the door by retracting the lock member to a door side; and
a linking posture corrective device to correct a linking posture of the pod, wherein the linking posture corrective device includes a pressing member provided on a periphery of the door to press a top and/or a side of the cover of the pod and capable of freely moving in a moving direction of a pod table and in a direction vertical thereto with a prescribed movable range.

5. A pod cover removing-installing apparatus to remove and install a cover for an opening of a pod, an inside of which is kept extremely clean, by causing the cover to engage a door for an opening of a high cleanliness room, while maintaining high cleanliness of the pod and the room by closely attaching a circumference of the two openings, the pod cover removing-installing apparatus comprising:

a positioning member to determine a position of the cover by engaging an engaged part of the cover; and a position securing device to position and secure the positioning member to the engaged part of the cover by changing an external diameter of the positioning member, wherein the position securing device is formed in the positioning member and has a split part to change a diameter thereof by a mechanical force, and wherein the positioning member includes:

an outer casing with a tapered end;

an inner casing installed freely movable in an axial direction of the outer casing, having a taper with an angle measuring the same as the taper of the outer casing at the tapered end, and arranged so that the two tapers become continuous when protruding; and a pushing device to push the inner casing in a protruding direction.

6. A pod cover removing-installing apparatus to remove and install a cover for an opening of a pod, an inside of which is kept extremely clean, by causing the cover to engage a door for an opening of a high cleanliness room, while maintaining high cleanliness of the pod and the room by closely attaching a circumference of the two openings, the pod cover removing-installing apparatus comprising:

a positioning member to determine a position of the cover by engaging an engaged part of the cover;

a position securing device to position and secure the positioning member to the engaged part of the cover by changing an external diameter of the positioning member; and a linking posture corrective device to correct a linking posture of the pod, wherein the linking posture corrective device includes a pressing member provided on the periphery of the door to press a top and/or a side of the cover of the pod and capable of freely moving in a moving direction of a pod table and in a direction vertical thereto with a prescribed movable range.

7. A pod cover removing-installing apparatus to remove and install a cover for an opening of a pod, an inside of which is kept extremely clean, by causing the cover to engage a door for an opening of a high cleanliness room, while maintaining high cleanliness of the pod and the room by closely attaching a circumference of the two openings, the pod cover removing-installing apparatus comprising:

a positioning member to determine a position of the cover, wherein the positioning member includes:

an outer casing with a tapered end;

an inner casing installed freely movable in an axial direction of the outer casing, having a taper with an angle measuring the same as the taper of the outer casing at the tapered end and arranged so that the two tapers become continuous when protruding; and a pushing device to push the inner casing in a protruding direction.

* * * * *